(12) United States Patent
Savage-Leuchs

(10) Patent No.: US 7,537,395 B2
(45) Date of Patent: May 26, 2009

(54) DIODE-LASER-PUMP MODULE WITH INTEGRATED SIGNAL PORTS FOR PUMPING AMPLIFYING FIBERS AND METHOD

(75) Inventor: Matthias P. Savage-Leuchs, Woodinville, WA (US)

(73) Assignee: Lockheed Martin Corporation, Bethesda, MD (US)

( * ) Notice: Subject to any disclaimer, the term of this patent is extended or adjusted under 35 U.S.C. 154(b) by 340 days.

(21) Appl. No.: 11/682,234

(22) Filed: Mar. 5, 2007

(65) Prior Publication Data

US 2008/0037604 A1   Feb. 14, 2008

Related U.S. Application Data

(60) Provisional application No. 60/778,753, filed on Mar. 3, 2006.

(51) Int. Cl.
*G02B 6/36* (2006.01)
(52) U.S. Cl. .............................. 385/92; 372/6
(58) Field of Classification Search ............ 372/6, 372/22, 43.01; 356/300; 385/89, 92, 135
See application file for complete search history.

(56) References Cited

U.S. PATENT DOCUMENTS

| | | | |
|---|---|---|---|
| 3,728,117 A | 4/1973 | Heidenhain et al. | |
| 4,313,648 A | 2/1982 | Yano et al. | |
| 4,367,040 A | 1/1983 | Goto | |
| 4,895,790 A | 1/1990 | Swanson et al. | |
| 4,995,696 A * | 2/1991 | Nishimura et al. | 359/333 |
| 5,319,668 A | 6/1994 | Luecke | |
| 5,379,310 A | 1/1995 | Papen et al. | |

(Continued)

FOREIGN PATENT DOCUMENTS

WO   WO 2004 099855 A1   11/2004

(Continued)

OTHER PUBLICATIONS

Augst, S. J., et al., "Wavelength beam combining of ytterbium fiber lasers", "Opt. Lett.", 2003, pp. 331-333, vol. 28, No. 5.

(Continued)

*Primary Examiner*—Minsun Harvey
*Assistant Examiner*—Tuan N. Nguyen
(74) *Attorney, Agent, or Firm*—Charles A. Lemaire; Lemaire Patent Law Firm, P.L.L.C.

(57) ABSTRACT

Apparatus and method for collimating pump light of a first wavelength from laser diode(s) into a collimated beam within an enclosure having first and second optical ports, directing pump light from the collimated beam to the first port; and directing signal light inside the enclosure between the first and second port. The signal and pump wavelengths are different. The enclosure provides a pump block having a first port that emits pump light to a gain fiber outside the enclosure and that also passes signal light either into or out of the enclosure, and another port that passes signal light either out of or into the enclosure. Some embodiments use a dichroic mirror to direct pump light to the first port and direct signal light between the first and second ports. Some embodiments include a wavelength-conversion device to change the wavelength of at least some of the signal light.

30 Claims, 8 Drawing Sheets

U.S. PATENT DOCUMENTS

| | | | |
|---|---|---|---|
| 5,440,416 | A | 8/1995 | Cohen et al. |
| 5,504,302 | A | 4/1996 | Hentze et al. |
| 5,526,155 | A | 6/1996 | Knox et al. |
| 5,608,826 | A | 3/1997 | Boord et al. |
| 5,642,447 | A | 6/1997 | Pan et al. |
| 5,661,835 | A * | 8/1997 | Kato et al. .................... 385/92 |
| 5,818,630 | A | 10/1998 | Fermann et al. |
| 5,847,863 | A | 12/1998 | Galvanauskas et al. |
| 5,907,436 | A | 5/1999 | Perry et al. |
| 5,974,060 | A | 10/1999 | Byren et al. |
| 6,023,361 | A | 2/2000 | Ford |
| 6,028,879 | A | 2/2000 | Ershov |
| 6,053,640 | A | 4/2000 | Miyokawa et al. |
| 6,072,931 | A * | 6/2000 | Yoon et al. .................. 385/135 |
| 6,081,635 | A | 6/2000 | Hehmann |
| 6,097,863 | A | 8/2000 | Chowdhury |
| 6,192,062 | B1 | 2/2001 | Sanchez-Rubio et al. |
| 6,208,679 | B1 | 3/2001 | Sanchez-Rubio et al. |
| 6,212,011 | B1 | 4/2001 | Lissotschenko et al. |
| 6,212,310 | B1 | 4/2001 | Waarts et al. |
| 6,275,623 | B1 | 8/2001 | Brophy et al. |
| 6,339,662 | B1 | 1/2002 | Koteles et al. |
| 6,381,008 | B1 | 4/2002 | Branagh et al. |
| 6,381,388 | B1 | 4/2002 | Epworth et al. |
| 6,384,981 | B1 | 5/2002 | Hauschild |
| 6,416,237 | B2 | 7/2002 | Lissotschenko et al. |
| 6,421,178 | B1 | 7/2002 | Lissotschenko et al. |
| 6,471,372 | B1 | 10/2002 | Lissotschenko et al. |
| 6,496,301 | B1 | 12/2002 | Koplow et al. |
| 6,513,992 | B2 * | 2/2003 | Andersen et al. .............. 385/92 |
| 6,621,631 | B2 | 9/2003 | Lissotschenko et al. |
| 6,621,638 | B2 | 9/2003 | Lissotschenko |
| 6,625,364 | B2 | 9/2003 | Johnson et al. |
| 6,665,471 | B1 | 12/2003 | Farmer et al. |
| 6,754,006 | B2 | 6/2004 | Barton et al. |
| 6,765,724 | B1 | 7/2004 | Kramer |
| 6,819,871 | B1 | 11/2004 | Baldwin et al. |
| 6,822,796 | B2 | 11/2004 | Takada et al. |
| 6,836,607 | B2 | 12/2004 | Dejneka et al. |
| 6,845,108 | B1 | 1/2005 | Liu et al. |
| 6,882,431 | B2 | 4/2005 | Teich et al. |
| 6,901,197 | B2 | 5/2005 | Hasegawa et al. |
| 6,914,916 | B2 | 7/2005 | Pezeshki et al. |
| 6,917,631 | B2 | 7/2005 | Richardson et al. |
| 6,937,795 | B2 | 8/2005 | Squires et al. |
| 6,950,692 | B2 | 9/2005 | Gelikonov et al. |
| 6,952,510 | B1 | 10/2005 | Karlsen et al. |
| 6,958,859 | B2 | 10/2005 | Hoose et al. |
| 6,960,027 | B1 | 11/2005 | Krah et al. |
| 6,985,506 | B2 | 1/2006 | Lissotschenko |
| 6,996,343 | B2 | 2/2006 | Neilson |
| 7,015,450 | B2 | 3/2006 | Mikhailov et al. |
| 7,027,228 | B2 | 4/2006 | Mikhailov |
| 7,035,014 | B2 | 4/2006 | Mikhailov et al. |
| 7,072,553 | B2 | 7/2006 | Johnson et al. |
| 7,075,739 | B2 | 7/2006 | Mikhailov et al. |
| 7,085,053 | B2 | 8/2006 | Mikhailov |
| 7,085,062 | B2 | 8/2006 | Hauschild |
| 7,113,327 | B2 | 9/2006 | Gu et al. |
| 7,190,705 | B2 | 3/2007 | Fermann et al. |
| 7,199,924 | B1 | 4/2007 | Brown et al. |
| 7,242,835 | B2 | 7/2007 | Busse et al. |
| 6,865,344 | B1 | 3/2008 | Johnson et al. |
| 2002/0114075 | A1 | 8/2002 | Lissotschenko et al. |
| 2002/0122644 | A1 | 9/2002 | Birks |
| 2002/0181856 | A1 | 12/2002 | Sappey et al. |
| 2003/0068150 | A1 | 4/2003 | Ariel et al. |
| 2003/0165313 | A1 | 9/2003 | Broeng et al. |
| 2004/0091217 | A1 | 5/2004 | Nawae et al. |
| 2004/0095968 | A1 | 5/2004 | Avizonis et al. |
| 2004/0114852 | A1 | 6/2004 | Brown |
| 2004/0213302 | A1 | 10/2004 | Fermann et al. |
| 2005/0041702 | A1 | 2/2005 | Fermann et al. |
| 2005/0105865 | A1 | 5/2005 | Fermann et al. |
| 2005/0105866 | A1 | 5/2005 | Grudinin et al. |
| 2005/0147370 | A1 | 7/2005 | Yusoff et al. |
| 2005/0152023 | A1 | 7/2005 | Lissotschenko et al. |
| 2005/0163426 | A1 | 7/2005 | Fermann et al. |
| 2005/0169590 | A1 | 8/2005 | Alkeskjold |
| 2005/0226286 | A1 | 10/2005 | Liu et al. |
| 2005/0259934 | A1 | 11/2005 | Temelkuran et al. |
| 2006/0067632 | A1 | 3/2006 | Broeng et al. |
| 2006/0120418 | A1 | 6/2006 | Harter et al. |
| 2006/0291512 | A1 | 12/2006 | Borschowa |
| 2007/0035810 | A1 | 2/2007 | Henderson |
| 2007/0041083 | A1 | 2/2007 | Di Teodoro et al. |
| 2007/0091948 | A1 | 4/2007 | Di Teodoro et al. |
| 2007/0104431 | A1 | 5/2007 | Di Teodoro et al. |
| 2007/0127123 | A1 | 6/2007 | Brown et al. |

FOREIGN PATENT DOCUMENTS

| | | |
|---|---|---|
| WO | WO 2005 012956 A1 | 2/2005 |
| WO | WO 2005 017601 A1 | 2/2005 |
| WO | WO 2006 072260 A1 | 7/2006 |
| WO | WO 2006 074684 A1 | 7/2006 |
| WO | WO 2006 094525 A1 | 9/2006 |
| WO | WO 2006 102908 A1 | 10/2006 |
| WO | WO 2006 119785 A1 | 11/2006 |
| WO | WO 2006 131334 A2 | 12/2006 |
| WO | WO 2007 019878 A1 | 2/2007 |

OTHER PUBLICATIONS

Blazephotonics (Company), "Hollow Core Photonic Bandgap Fiber HC-580-01 Product Description", "http://www.crystal-fibre.com/datasheets/HC-580-01.pdf", Feb. 10, 2006.

Blazephotonics (Company), "High NA Multimode Fiber MM-37-01 Product Description", "http://www.crystal-fibre.com/datasheets/MM-37-01.pdf", 2005.

Champert, P. A., etal , "3.5 W frequency-doubled fiber-based laser source at 772 nm", "Applied Physics Letters", Apr. 23, 2001, pp. 2420-2421, vol. 78, No. 17.

Cooper, L. J., et al., "High-power Yb-doped multicore ribbon fiber laser", Nov. 1, 2005, pp. 2906-2908, vol. 30, No. 21.

Crystal Fibre (Company), "High-Power Fiber Laser and Amplifier Subassembly Modules Product Description", "http://www.crystal-fibre.com/products/subassemblies.shtm", 2005 (copyright).

Crystal Fibre (Company), "Multimode Ultra High NA Photonic Crystal Fiber MM-HNA-110 Product Description", "http://www.crystal-fibre.com/datasheets/MM-HNA-110.pdf", Apr. 2005.

Crystal Fibre (Company), "Multimode Ultra High NA Photonic Crystal Fiber MM-HNA-200 Product Description", "http://www.crystal-fibre.com/datasheets/MM-HNA-200.pdf", Apr. 2005.

Crystal Fibre (Company), "Multimode Ultra High NA Photonic Crystal Fiber MM-HNA-35 Product Description", "http://www.crystal-fibre.com/datasheets/MM-HNA-35.pdf", Apr. 2005.

Crystal Fibre (Company), "Multimode Ultra High NA Photonic Crystal Fiber MM-HNA-5 Product Description", "http://www.crystal-fibre.com/datasheets/MM-HNA-5.pdf", Apr. 2005.

Crystal Fibre (Company), "Towards 100 kW fiber laser systems Scaling up power in fiber lasers for beam combining", "http://www.crystal-fibre.com/support/White_Paper_-_Towards_100kW_fiber_laser_systems_-_Scaling_up_power_in_fiber_lasers_for_beam_combining.pdf", Feb. 28, 2006.

Fan, T. Y., "Laser Beam Combining for High-Power, High Radiance Sources", "IEEE Journal of Selected Topics in Quantum Electronics", 2005, pp. 567-577, vol. 11.

Galvanauskas, Almantas, "Mode-scalable fiber-based chirped pulse amplification systems", "IEEE Journal on Selected Topics in Quantum Electronics", Jul. 2001, pp. 504-517, vol. 7, No. 4.

Hehl, Karl, et al., "High-efficiency dielectric reflection gratings: design, fabrication, and analysis", "Appl. Opt.", 1999, pp. 6257-6271, vol. 38.

Krause, J. T., et al., "Arc Fusion Splices with Near Pristine Strengths and Improved Optical Loss", "22nd European Conference on Optical Communication—EEOC'96, Oslo, Norway", 1996, pp. 237-240, vol. 2.

Liem, A., et al., "100-W single-frequency master-oscillator fiber power amplifier", "Optics Letters", Sep. 1, 2003, pp. 1537-1539, vol. 28, No. 17.

Limpert, J., etal, "High power Q-switched Yb-doped photonic crystal fiber laser producing sub-10 ns pulses", "Appl. Phys. B 81", 2005, pp. 19-21.

Liu, F., et al., "Cost-effective wavelength selectable light source using DFB fibre laser array", "Electronics Letters", Mar. 30, 2000, pp. 620-621, vol. 36, No. 7.

Liu, A. et al., "Spectral beam combining of high power fiber lasers", "Proceedings of SPIE", 2004, pp. 81-88, vol. 5335.

Perry, M. D., et al., "High-efficiency multilayer dielectric diffraction gratings", "Opt. Lett.", 1995, pp. 940-942, vol. 20.

Sorensen, T., et al., "Metal-assisted coupling to hollow-core photonic crystal fibres", "Electronics Letters", Jun. 9, 2005, vol. 41, No. 12.

Tunnerman, A., etal, "The renaissance and bright future of fibre lasers", "Journal of Physics B: Atomic, Molecular and Optical Physics", 2005, pp. S681-S693, vol. 38.

Brooks, Christopher D, et al., "1-mJ energy, 1-MW peak-power, 10-W averagepower, spectrally narrow, diffraction-limited pulses from a photonic-crystal f", "Optics Express", Oct. 31, 2005, pp. 8999-9002, vol. 13, No. 22.

Di Teodoro, Fabio, et al., "Harmonic generation of an Yb-doped photonic-crystal fiber amplifier to obtain 1ns pulses of 410, 160, and 190kW peak-pow", "Advanced Solid-State Photonics 29 Technical Digest, Paper ME3", 2006.

Di Teodoro, Fabio, et al., "1.1 MW peak-power, 7 W average-power, high-spectral-brightness, diffraction-limited pulses from a photonic crystal fiber", "Optics Letters", Oct. 15, 2005, pp. 2694-2696, vol. 30, No. 20.

Henderson, Angus, et al., "Low threshold, singly-resonant CW OPO pumped by an all-fiber pump source", "Optics Express", Jan. 3, 2006, pp. 767-772, vol. 14, No. 2.

Kristiansen, Rene E., et al., "Microstructured fibers and their applications", "Proceedings of the 4th Reunion Espanola of Optoelectronics (OPTOEL), CI-5", 2005, pp. 37-49.

Limpert, J., et al., "High-power rod-type photonic crystal fiber laser", "Optics Express", Feb. 21, 2005, pp. 1055-1058, vol. 13, No. 4.

Limpert, J., et al., "Low-nonlinearity single-transverse-mode ytterbium-doped photonic crystal fiber amplifier", "Optics Express", Apr. 5, 2004, pp. 1313-1319, vol. 12, No. 7.

Moutzouris, Konstantinos, et al., "Highly efficient second, third and fourth harmonic generation from a two-branch femtosecond erbium fiber source", "Optics Express", Mar. 6, 2006, pp. 1905-1912, vol. 14, No. 5.

\* cited by examiner

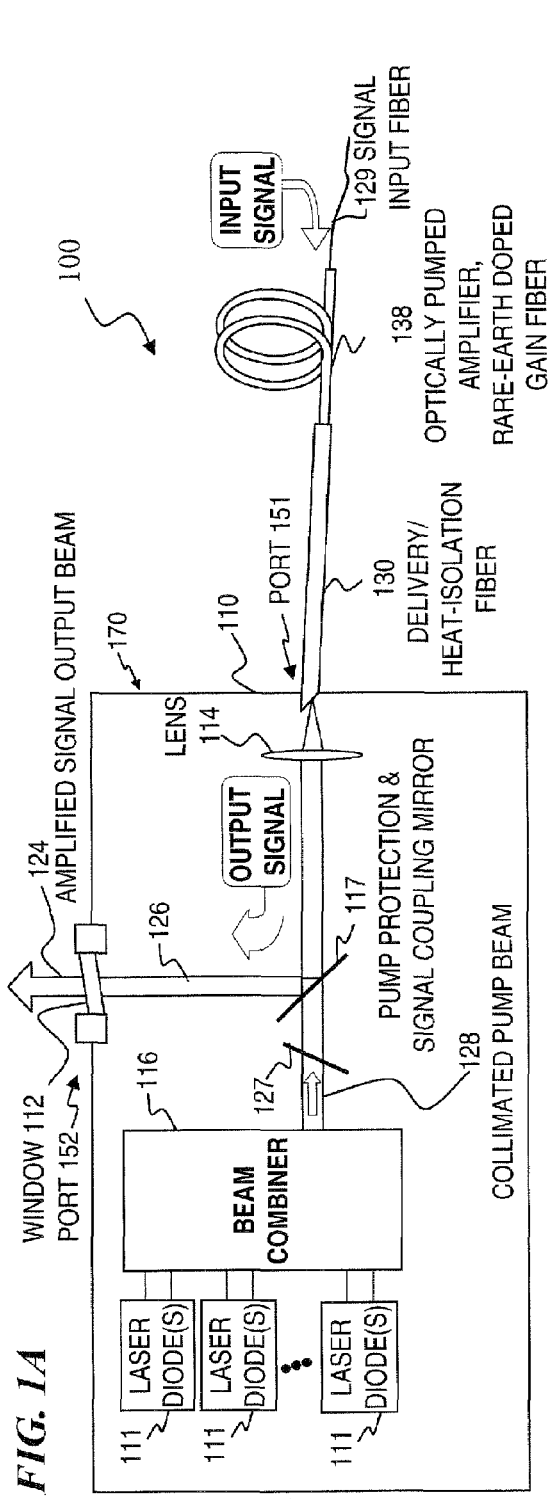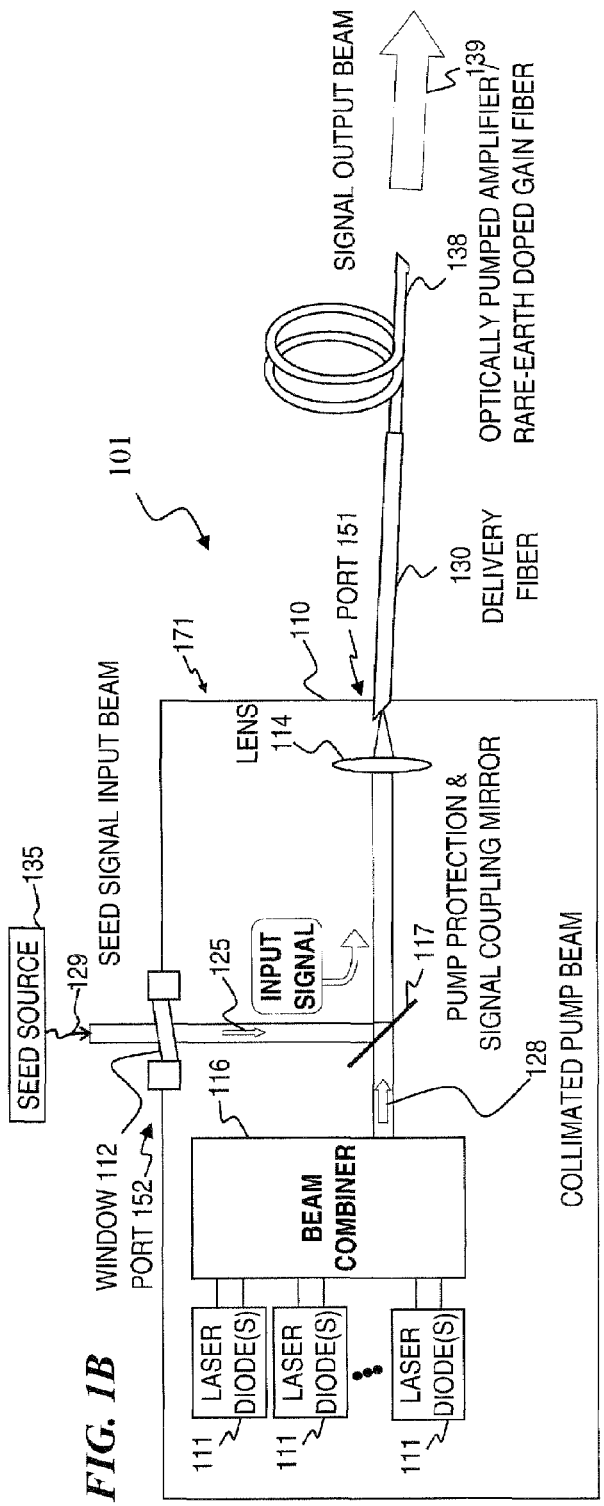

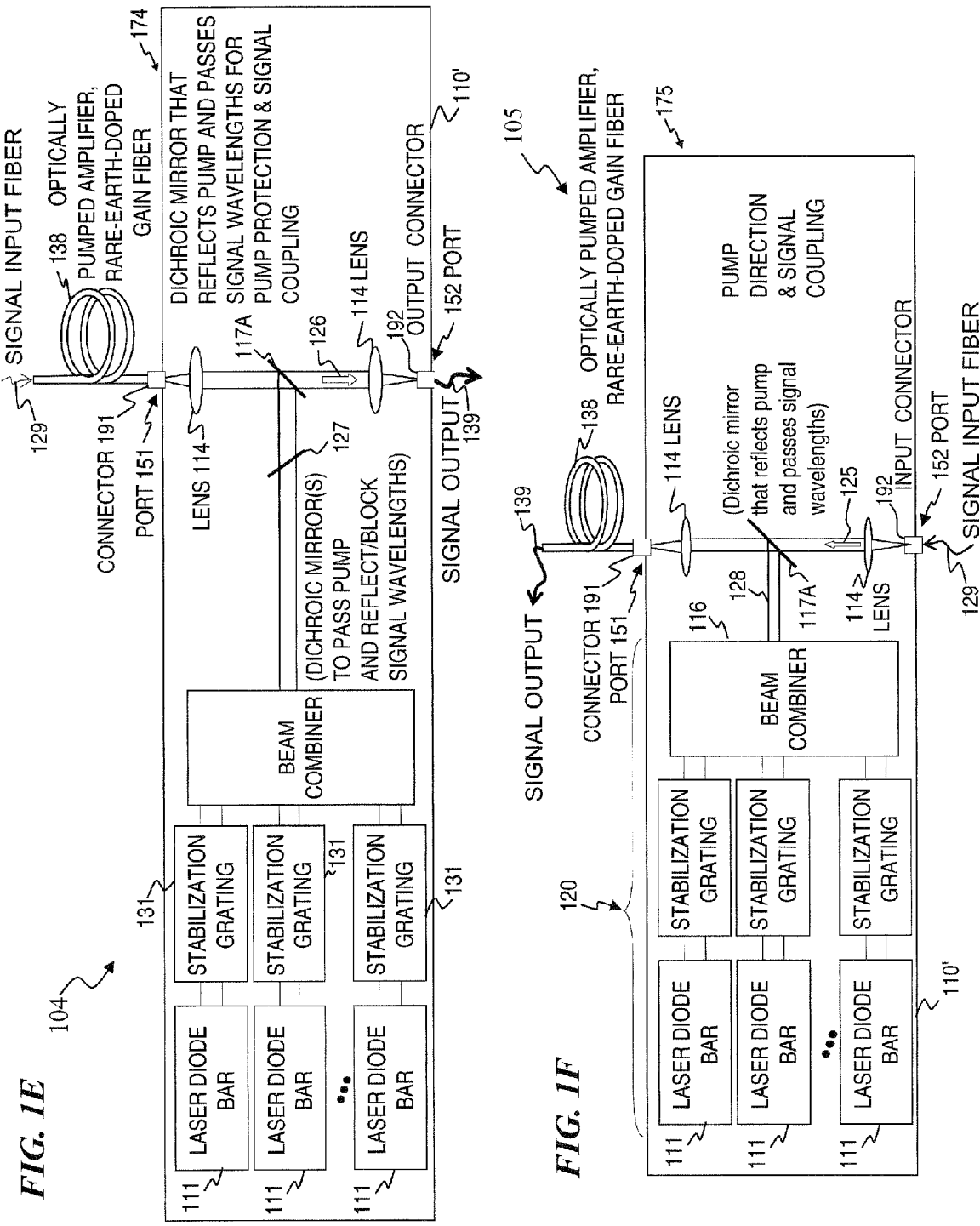

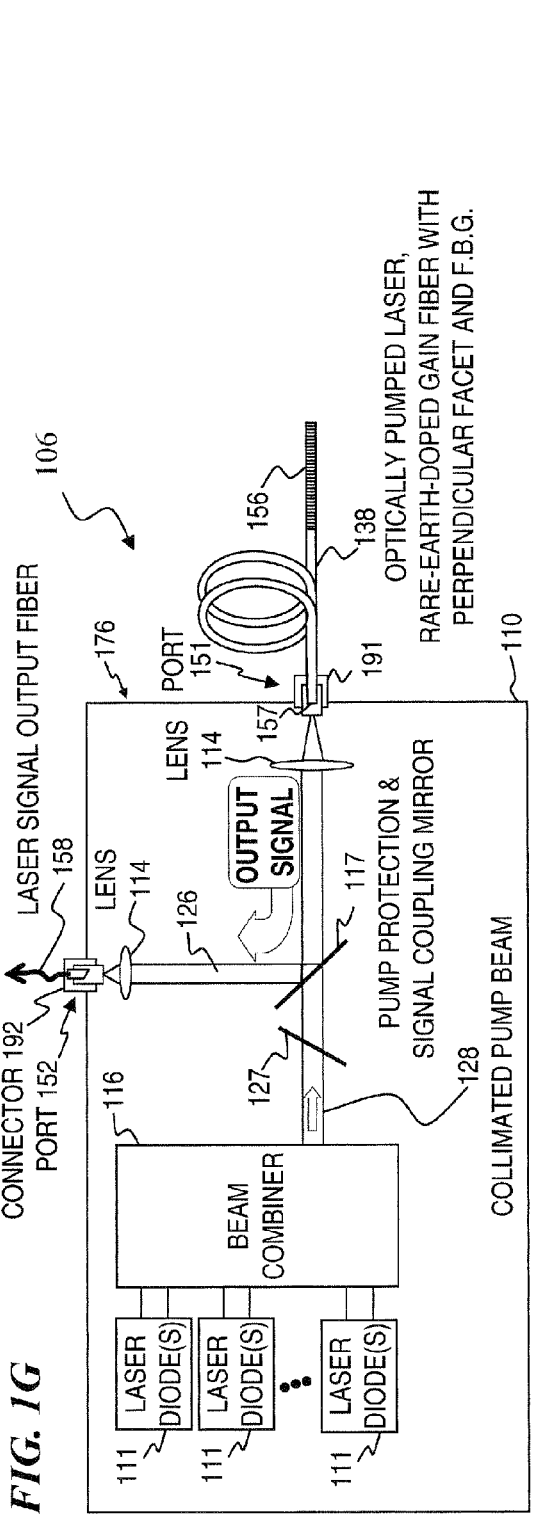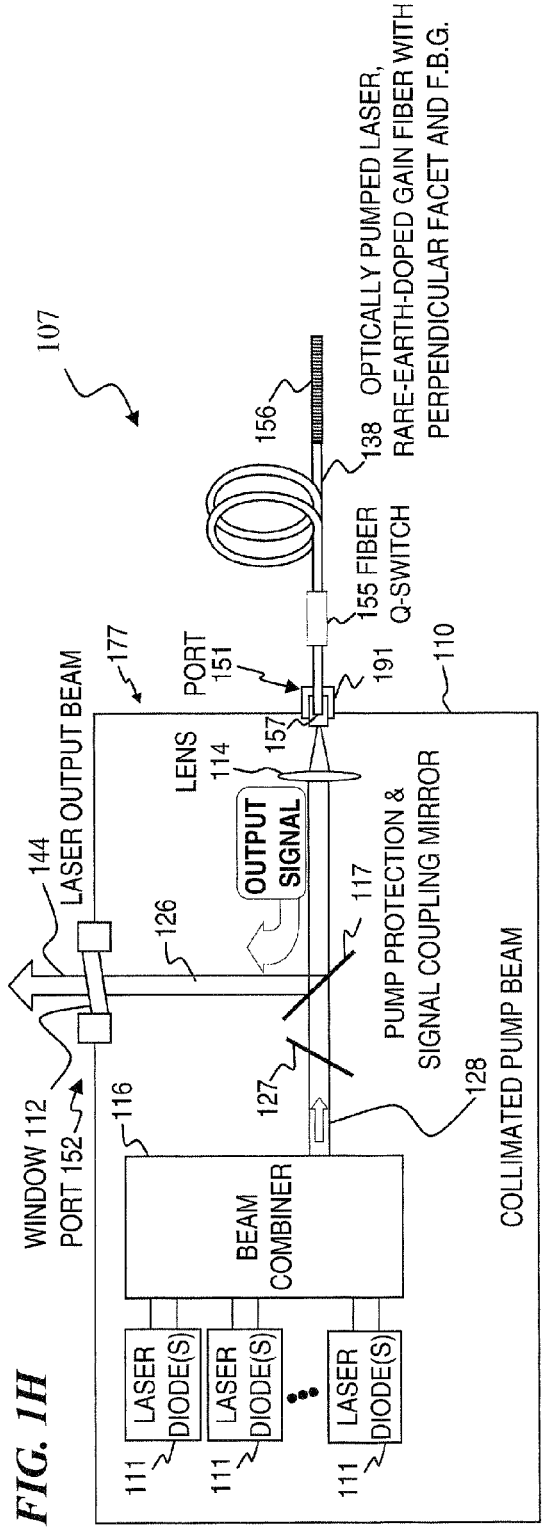

DIODE-LASER-PUMP MODULE WITH INTEGRATED SIGNAL PORTS FOR PUMPING AMPLIFYING FIBERS AND METHOD

CROSS-REFERENCE TO RELATED APPLICATIONS

This application claims benefit under 35 U.S.C. 119(e) of U.S. Provisional Patent Application No. 60/778,753, filed on 3 Mar. 2006, titled "DIODE LASER FOR PUMPING FIBER LASERS, WITH INTEGRATED SIGNAL INPUT/OUTPUT PORT", which is incorporated herein by reference in its entirety.

STATEMENT REGARDING FEDERALLY SPONSORED RESEARCH OR DEVELOPMENT

This invention was made with Government support from the Department of Energy under contract number DE-FG02-03ER83589. The Government has certain rights in the invention.

This invention is also related to

U.S. Provisional Patent Application No. 60/703,822, titled "FIBER-BASED OPTICAL SOURCE FEATURING A LARGE-CORE, RARE-EARTH-DOPED PHOTONIC CRYSTAL FIBER FOR GENERATION OF HIGH POWER PULSED RADIATION", filed 29 Jul. 2005;

U.S. Provisional Patent Application No. 60/746,166, titled "FIBER- OR ROD-BASED OPTICAL SOURCE FEATURING A LARGE-CORE, RARE-EARTH-DOPED PHOTONIC-CRYSTAL DEVICE FOR GENERATION OF HIGH-POWER PULSED RADIATION AND METHOD", filed 1 May 2006;

U.S. Provisional Patent Application No. 60/797,931, titled "FIBER- OR ROD-BASED OPTICAL SOURCE FEATURING A LARGE-CORE, RARE-EARTH-DOPED PHOTONIC-CRYSTAL DEVICE FOR GENERATION OF HIGH-POWER PULSED RADIATION AND METHOD", filed 5 May 2006;

U.S. Provisional Patent Application No. 60/885,916, titled "HIGH-ENERGY EYE-SAFE PULSED FIBER AMPLIFIERS AND SOURCES OPERATING IN L-BAND", filed 21 Jan. 2007;

U.S. patent application Ser. No. 11/342,336, titled "APPARATUS AND METHOD FOR SPECTRAL-BEAM COMBINING OF HIGH-POWER FIBER LASERS", filed 26 Jan. 2006;

U.S. patent application Ser. No. 11/165,676, titled "APPARATUS AND METHOD FOR DRIVING LASER DIODES", filed 24 Jun. 2005;

U.S. patent application Ser. No. 11/420,729, titled "FIBER- OR ROD-BASED OPTICAL SOURCE FEATURING A LARGE-CORE, RARE-EARTH-DOPED PHOTONIC-CRYSTAL DEVICE FOR GENERATION OF HIGH-POWER PULSED RADIATION AND METHOD", filed 26 May 2006;

U.S. patent application Ser. No. 11/420,730, titled "MULTI-SEGMENT PHOTONIC-CRYSTAL-ROD WAVEGUIDES FOR AMPLIFICATION OF HIGH-POWER PULSED OPTICAL RADIATION AND ASSOCIATED METHOD", filed 26 May 2006;

U.S. patent application Ser. No. 11/420,732, titled "MULTI-STAGE OPTICAL AMPLIFIER HAVING PHOTONIC-CRYSTAL WAVEGUIDES FOR GENERATION OF HIGH-POWER PULSED RADIATION AND ASSOCIATED METHOD", filed 27 May 2006;

U.S. patent application Ser. No. 11/420,750 titled "PHOTONIC-CRYSTAL-ROD OPTICAL AMPLIFIER WITH SEALED-HOLE ENDCAP AND ASSOCIATED METHOD" filed 27 May 2006, U.S. patent application Ser. No. 11/420,752, titled "OPTICAL HOLLOW-CORE DELIVERY FIBER AND HOLLOW-ENDCAP TERMINATION AND ASSOCIATED METHOD", filed 27 May 2006;

U.S. patent application Ser. No. 11/420,755, titled "CHIRPED-PULSE AMPLIFIER USING PHOTONIC-CRYSTAL-ROD (PCR) WAVEGUIDES AND ASSOCIATED METHOD", filed 28 May 2006;

U.S. patent application Ser. No. 11/420,756, titled "METHOD AND APPARATUS FOR SPECTRAL-BEAM COMBINING OF MEGAWATT-PEAK-POWER BEAMS FROM PHOTONIC-CRYSTAL RODS", filed 28 May 2006;

U.S. patent application Ser. No. 11/426,302, titled "APPARATUS AND METHOD FOR A HIGH-GAIN DOUBLE-CLAD AMPLIFIER", filed 23 Jun. 2006;

U.S. patent application Ser. No. 11/484,358, titled "APPARATUS AND METHOD FOR PUMPING AND OPERATING OPTICAL PARAMETRIC OSCILLATORS USING DFB FIBER LASERS", filed 10 Jul. 2006;

U.S. patent application Ser. No. 11/488,910, titled "APPARATUS AND METHOD FOR GENERATING CONTROLLED-LINEWIDTH LASER-SEED-SIGNALS FOR HIGH-POWERED FIBER-LASER AMPLIFIER SYSTEMS", filed 17 Jul. 2006;

U.S. patent application Ser. No. 11/556,658, titled "APPARATUS AND METHOD FOR A WAVEGUIDE WITH AN INDEX PROFILE MANIFESTING A CENTRAL DIP FOR BETTER ENERGY EXTRACTION", filed 3 Nov. 2006;

U.S. patent application Ser. No. 11/558,362, titled "ULTRAVIOLET LASER SYSTEM AND METHOD HAVING WAVELENGTH IN THE 200-NM RANGE", filed 9 Nov. 2006;

U.S. patent application Ser. No. 11/565,619, titled "METHOD AND APPARATUS FOR OPTICAL GAIN FIBER HAVING SEGMENTS OF DIFFERING CORE SIZES", filed 30 Nov. 2006; and U.S. patent application Ser. No. 11/567,740, titled "APPARATUS AND METHOD FOR AN ERBIUM-DOPED FIBER FOR HIGH PEAK-POWER APPLICATIONS", filed 7 Dec. 2006; each of which is hereby incorporated herein by reference.

FIELD OF THE INVENTION

The invention relates generally to high-power optical fiber amplifiers and lasers and more particularly to methods and apparatus for making and using a diode-laser-pump module with integrated signal ports for pumping amplifying fibers.

BACKGROUND OF THE INVENTION

Optically pumped optical gain fibers require pump light to be injected into the gain fiber. High-powered gain fibers require high-power pump sources. One pump-source configuration includes a plurality of laser bars (each having a plurality of diode lasers) and beam-shaping optics in a single metal enclosure package. LIMO GmbH of Dortmund, Germany (e.g., see www.limo.de/en/laserpump.php) is one source of such laser-diode pump modules, which are offered in a variety of pump powers, pump wavelengths, and output fiber characteristics. In some such pump blocks, laser light from a plurality of laser-diode bars is combined using one or more beam shapers (such as described in U.S. Pat. Nos. 6,416,237, 6,421,178, 6,471,372, 6,985,586, 7,027,228, 7,035,014, 7,075,739, and 7,085,062, which are hereby incorporated herein by reference)

There is a need for systems and methods that provide more efficient and cost-effective coupling of pump light to a gain fiber and coupling of signal light from the gain fiber.

BRIEF SUMMARY OF THE INVENTION

In some embodiments, the present invention provides a diode laser pump subsystem for generating pump light for fiber lasers or amplifiers, with an enclosure having a pump-light port and integrated signal input/output port. Some embodiments include an apparatus and method for collimating pump light of a first wavelength from laser diode(s) into a collimated beam within an enclosure having first and second optical ports, directing pump light from the collimated beam to the first port; and directing signal light inside the enclosure between the first and second port. The signal and pump wavelengths are different. The enclosure provides a laser pump block having two ports—one (the pump-signal port) that emits pump light to a gain fiber outside the enclosure and that also passes signal light either into or out of the enclosure (from or to the gain fiber), and another port (the signal port) that passes signal light either out of or into the enclosure. Some embodiments use a dichroic mirror to direct pump light to the first port and direct signal light between the first and second ports. Some embodiments include a wavelength-conversion device to change the wavelength of at least some of the signal light. Some embodiments include a gain medium coupled to the pump-signal port; and one or more feedback elements configured to form a laser using the gain medium. Some such embodiments include a Q-switch element, either in the gain fiber or in the enclosure, to form a Q-switched laser.

BRIEF DESCRIPTION OF THE FIGURES

FIG. 1A is a block diagram of a diode laser subsystem 100 for pumping gain fibers, with an integrated signal output port 152 and a fused delivery fiber 130 for connecting to an optically pumped gain fiber 138.

FIG. 1B is a block diagram of a diode laser subsystem 101 for pumping gain fibers, with an integrated signal input port 152 and a fused delivery fiber 130 for connecting to an optically pumped gain fiber 138.

FIG. 1E is a block diagram of a diode laser subsystem 104 for pumping gain fibers, with an integrated signal output port 152 and a fiber connector 191 for connecting to an optically pumped gain fiber 138.

FIG. 1F is a block diagram of a diode laser subsystem 105 for pumping gain fibers, with an integrated signal input port 152 and a fiber connector 191 for connecting to an optically pumped gain fiber 138.

FIG. 1G is a block diagram of a diode laser subsystem 106 for pumping a gain fiber to form a laser, with an integrated signal output port 152 and a threaded fiber connector 191 at pump/signal port 151 for connecting to an optically pumped gain fiber 138.

FIG. 1H is a block diagram of a diode laser subsystem 107 for pumping gain fibers to form Q-switched lasers, with an integrated signal output port 152 and a threaded fiber connector 191 at pump/signal port 151 for connecting to an optically pumped gain fiber 138.

DETAILED DESCRIPTION OF THE INVENTION

Although the following detailed description contains many specifics for the purpose of illustration, a person of ordinary skill in the art will appreciate that many variations and alterations to the following details are within the scope of the invention. Accordingly, the following preferred embodiments of the invention are set forth without any loss of generality to, and without imposing limitations upon the claimed invention.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

Figure 1C:
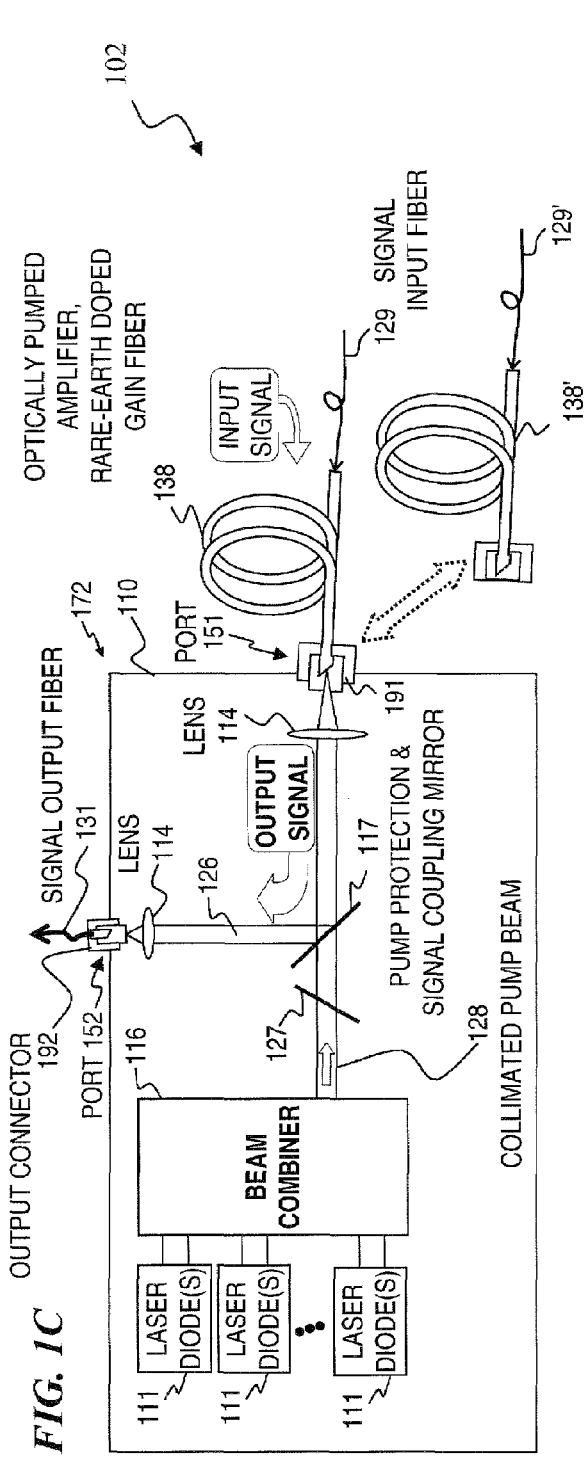
FIG. 1C is a block diagram of a diode laser subsystem 102 for pumping gain fibers, with an integrated signal output port 152 and a fiber connector 191 at pump/signal port 151 for connecting to an optically pumped gain fiber 138.

FIG. 1A is a block diagram of a diode laser subsystem 100 for pumping a gain fiber 138, with an integrated signal output port 152 having a window 112 for the output beam 124 and a delivery fiber 130 that functions as pump-signal port 151 for connecting to an optically pumped gain fiber 138. (Instead of using a window 112 for the output beam 124, some embodiments connect a output-signal fiber 131 to port 152 (as shown in FIG. 1C and described below) using a lens 114 to focus the output beam onto the end of signal fiber 131, optionally using a connector 192 or a laser-welded, soldered, or fused signal-fiber connection, such as shown on port 151 of FIG. 1A, enabling very-high-precision positioning of the end of signal fiber 131 relative to focused signal beam 126.) In some embodiments, delivery fiber 130 is laser welded, soldered, fused or otherwise permanently attached to enclosure 110 (also called a pump-diode-laser housing 110, module housing 110, pump-block housing 110, pump-diode module housing 110, diode enclosure 110 or the like) of pump-diode module 170 (also called pump-block module 170, diode module 170, or pump-block 170). In some embodiments, delivery fiber 130 is a photonic-bandgap fiber (e.g., one having an air core). In some embodiments, the outside of the end of delivery fiber 130 is metallized and soldered to housing 110, in order to provide fixed tight tolerances relative to the focussing optics (e.g., lens(es) 114), which can then be adjusted to the position of the now-fixed fiber end and locked in place (e.g., by soldering) to ensure a high-efficiency, low-loss interface. In some embodiments, delivery fiber 130 is fused to gain fiber 138; while in other embodiments, the connection is made in a changeable manner using a threaded connector between delivery fiber 130 and gain fiber 138. In some embodiments, enclosure 110 is a hermetically sealed enclosure (e.g., made of metal such as aluminum or stainless steel, or other suitable material). In some embodiments of fiber-coupled pump-laser-diode subsystem 100, beam shaping is performed by beam-combiner 116 in the diode enclosure (module) 110 to couple light from one or more laser diodes or laser diode bars 111 (each having a plurality of laser diodes that emit pump light for powering optical-fiber amplifiers), focused by lens 114 into a passive pigtail (delivery) fiber 130, which is used to deliver the pump light towards the optically pumped gain section 138 (e.g., an optical fiber of a suitable glass doped with one or more rare-earth-ion species that are optically pumped to provide light amplification by stimulated emission of radiation). In some embodiments, beam-combiner 116 includes, e.g., one or more beam shapers that combine light from one or more lines of diode lasers or laser bars (such as described in U.S. Pat. Nos. 6,416,237, 6,421,178, 6,471,372, 6,985,586, 7,027,228, 7,035,014, 7,075,739, and 7,085,062, and/or one or more spectral-beam combiners such as described in U.S. patent application Ser. No. 11/420,756 titled "METHOD AND APPARATUS FOR SPECTRAL-BEAM COMBINING OF MEGAWATT-PEAK-POWER BEAMS FROM PHOTONIC-CRYSTAL RODS" filed 28 May 2006; and U.S. patent application Ser. No. 11/342,336, titled "APPARATUS AND METHOD FOR SPECTRAL-BEAM COMBINING OF HIGH-POWER FIBER LASERS", filed 26 Jan. 2006) that combine laser beams having different wavelengths.

In some embodiments, the present invention provides feedback protection (i.e., blocking or redirecting signal light) for the laser diodes 111, and has incorporated protection dichroic mirror 117 in diode module 110 to separate possible amplified optical signal feedback at the signal wavelength of the amplifier from coming back to the pump-source laser diodes along the path of pump beam 128 (some embodiments optionally add one or more additional dichroic mirrors 127 (or other dispersive elements such as a Pelin-Broca prism or a transmission grating) that are substantially transparent to pump-light wavelengths (so that collimated pump-light beam 128 passes through each one from left to right, while reflecting signal wavelengths to the side where they are absorbed or transmitted out of enclosure 110)). In some embodiments, the dichroic mirror 117 is placed in the collimated section of pump beam 128 and is used to direct the signal output upward while passing the pump wavelengths towards the right, while in other embodiments dichroic mirror 117 (or other suitable wavelength-selective optical element) is placed in a diverging section or a converging section of pump beam 128. In some embodiments, a section of fiber 129 is fused to the second (right-hand) end of gain fiber 138, and injects a seed signal from a master laser source or oscillator (this configuration is often called a master oscillator—power amplifier (MOPA) configuration). In the configuration of FIG. 1A, the signal light counter-propagates relative to the pump light (they travel in opposite directions), such that the highest signal power is in the portion of gain fiber 138 having the highest pump power, enabling very high-power signal output and minimizing non-linear optical background (spectrum broadening and degradation). In some embodiments, the seed signal source is pulsed, and the pump light is applied continuously, such that a relatively low-power pump is used to generate a very high power pulse or series of pulses. In other embodiments, the pump light is pulsed and the signal light is pulsed, such as described in U.S. patent application Ser. No. 11/165,676, titled "APPARATUS AND METHOD FOR DRIVING LASER DIODES" and U.S. patent application Ser. No. 11/488,910, titled "APPARATUS AND METHOD FOR GENERATING CONTROLLED-LINEWIDTH LASER-SEED-SIGNALS FOR HIGH-POWERED FIBER-LASER AMPLIFIER SYSTEMS".

In some embodiments, the signal reflectivity of the dichroic mirror(s) reduces the signal power going backwards onto the diodes by 60 dB to 90 dB (e.g., for a 1000 watts signal power going into the module 172, only 1 milliwatt (or even as little as 1 microwatt) goes onto the pump diodes 111, and that power is spread across all the diodes). In some embodiments, additional dichroic mirrors are added, which then can increase the blocking effectiveness to 120 dB or more. In some embodiments, the amplified signal is 10 watts average power, but up to 100 KW peak power when pulsed signals are amplified. In some embodiments, the $M^2$ quality of the signal is diffraction limited, and approaches a value of 1.0.

In some embodiments, the gain fiber 138 is erbium-ytterbium co-doped having a pedestal core-index profile (configured to have a pump wavelength of approximately 977 nm and a signal wavelength of approximately 1550 nm). In some embodiments, the gain fiber 138 is a photonic-crystal fiber. In some embodiments, the gain fiber 138 is ytterbium doped (configured to have a pump wavelength of approximately 977 nm and a signal wavelength of approximately 1060 nm). In other embodiments, other dopants or co-dopants are used. In some embodiments, the gain fiber has a core diameter of 100 micrometers (microns) or more (frequently called large-mode-area fibers or rods).

In some embodiments, the configuration of FIG. 1A (where the high-power signal pulses are reflected by dichroic mirror 117) helps prevent optical damage to dichroic mirror 117 that might occur if instead the signal were passed through the dichroic mirror and the pump light reflected (such as in the configuration shown in FIG. 1E).

In some embodiments, such as shown in FIG. 1A, the present invention provides an input/output window 112 in the diode module 110 (i.e., the package or enclosure for the diode lasers 111) to enable output of the amplified signal beam 124 (at the signal wavelength) away from the gain fiber 138 (any suitable amplifying fiber or rod doped with a suitable active species such as erbium and/or ytterbium) being pumped by the laser diode module 110 (this amplified signal beam is labeled 126 when inside the module 110) and/or to enable the input of seed signal beam 125 (see FIG. 1B) towards the gain fiber 138 (i.e., the same configuration of parts in module 110 is used for FIG. 1A and FIG. 1B). In some embodiments, additional lenses 114 are added as needed to focus and/or collimate the pump and/or signal beams in housing 110.

FIG. 1B is a block diagram of a diode laser subsystem 101 for pumping gain fibers, with module 171 having an integrated port 152 (e.g., having a signal-input window 112 for receiving a seed laser signal to be amplified) and a fused delivery fiber 130 (i.e., a fiber fused to housing 110) at pump-output port 151 (which also serves as a seed-signal output port) for connecting to an optically pumped gain fiber 138 used to amplify the seed signal and output the amplified result at the right-hand end. In some embodiments, a seed source 135 (a relatively low-power laser emitting laser light at the seed-signal wavelength) generates a seed signal through fiber 129 that is directed (optionally using optics not shown here) through window 112 (this un-amplified seed signal beam is labeled as beam 125 when inside the module 171). In some embodiments, module 171 of subsystem 101 is identical in structure to module 170 of subsystem 100 of FIG. 1A, except that the signal light travels in the opposite direction. Since this configuration has the relatively low-power seed signal 125 inside module 171, the power-handling requirements can be lower than in module 170 of FIG. 1A, where the amplified signal 126 is inside the module 170. In the configuration of FIG. 1B, the signal light 125 co-propagates relative to the pump light 128 (they travel in the same direction), and the amplified signal output beam 139 is extracted at the right-hand end of gain fiber 138.

In contrast to a standard pump block (similar to pump-block module 371 shown in FIG. 3A, which has no signal window 112 or signal-fiber connector 192 or other type of signal port 152), which may include a pump-protection dichroic mirror 113 to deflect signal light that back-propagated from a gain fiber 138, and which is then just absorbed in the standard pump block module, the present invention can use many of the same parts already used, but adds a signal port 152, and uses the pump-block module 170 to combine and/or separate pump and signal beams, and to provide a signal-beam port 152. In some embodiments, the coupling efficiency between the pump and the gain fiber is increased due to fewer components, as compared to configurations having pump-beam windows or other pump-block sealed interfaces (such as fiber connectors) for outputting the pump beam, and signal splitters outside such conventional pump-block module that are in addition to dichroic beam splitters inside the pump-block module, which may need to be there anyway to prevent any signal leaked back into the pump module from reaching and damaging the laser diodes.

In contrast to standard pump blocks and pump-beam/signal-beam combiners that are quite specific in regard to the geometrical gain fiber specifications and require significant non-recoverable engineering expense (NRE) to upgrade to different gain fibers, the combiners of the present invention are a very versatile tool and, in some embodiments, have the following advantages:

(a) The device of the present invention is substantially not affected by changes of the core specifications (e.g., the size of the core, its numerical aperture (NA), whether the core is defined by graded index, step index, photonic-crystal structures, or the like) of the fiber, in contrast to star couplers that typically have to be redesigned if the fiber changes.

(b) The device of the present invention is affected by changes of the pump-waveguide dimensions when the pump waveguide diameter is changed to a smaller diameter. Larger pump waveguides are always compatible with the combiner.

(c) Smaller pump waveguide diameters can easily be accommodated with minimal NRE. In particular when the NA (numerical aperture) of the pump waveguide of the gain fiber is larger than NA>0.2, which is typically used for standard fiber-coupled pump diodes.

(d) Exchanging gain fibers can be done in minutes, compared to a much longer time to exchange parts fused to a star coupler. Further, many star coupler configurations are also leaky, leading to signal loss from the core in the double cladding (pump waveguide) and pump power losses (typically 5-10%) when combining the multiple pump ports into the double cladding of the gain fiber.

(e) The device of the present invention works with non polarization-maintaining (PM) components and non-PM parts (e.g., a gain fiber using a keyed connector) that can be exchanged for PM parts (e.g., a PM gain fiber using a keyed connector), which is quite hard to do using a star coupler.

Figure 1D:
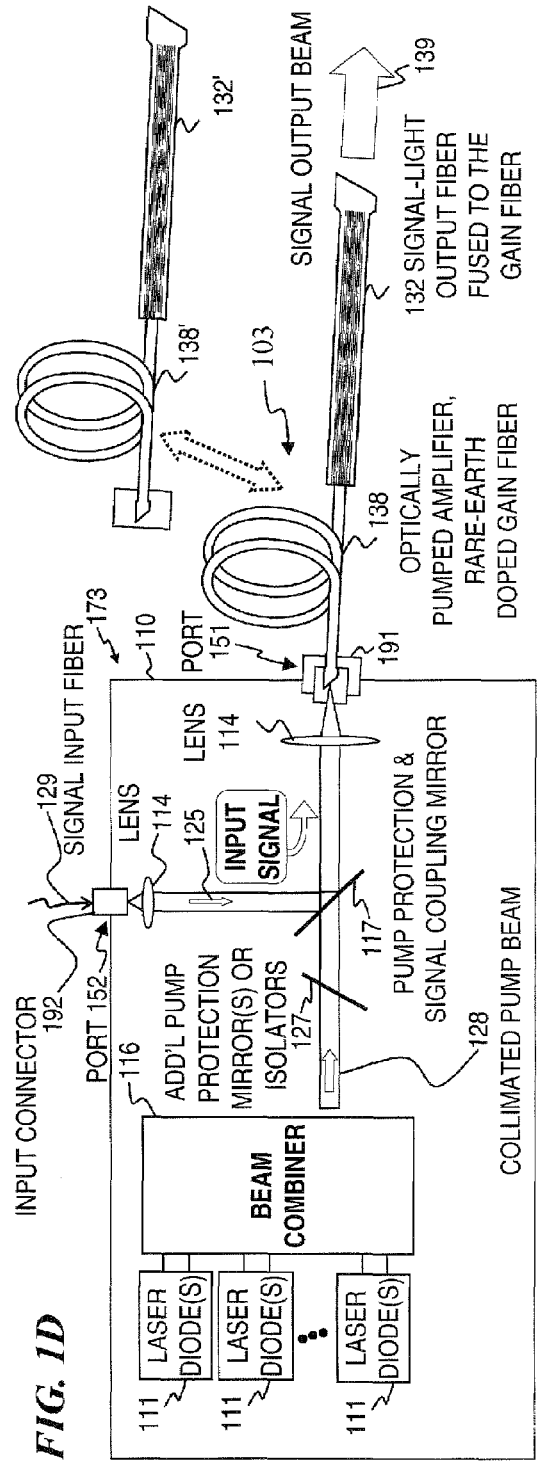
FIG. 1D is a block diagram of a diode laser subsystem 103 for pumping gain fibers, with an integrated signal input port 152 and a fiber connector 191 for connecting to an optically pumped gain fiber 138.
Figure 1I:
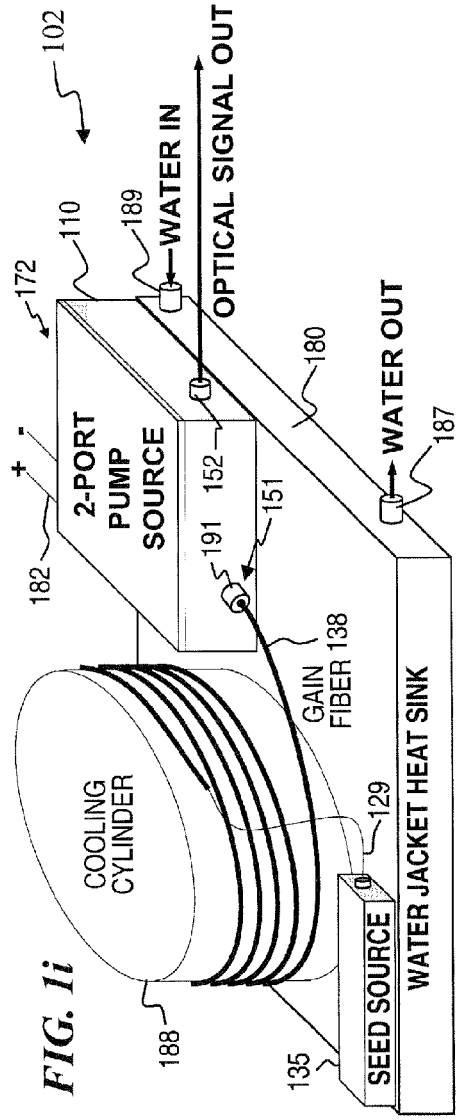
FIG. 1i is a perspective view of a diode laser subsystem 102 for pumping gain fibers, with an integrated signal output port 152 and a threaded fiber connector 191 at pump/signal port 151 for connecting to an optically pumped gain fiber 138.

(f) The device of the present invention can be applied for use with a laser (see the configurations of FIG. 1G, FIG. 1H, and FIG. 1i, some of which use a flat perpendicular cleaved end of the gain fiber at the pump connector end, and a fiber Bragg grating (FBG) at the opposite end, and is readily changed to an amplifier configuration (such as MOPA) without any change to the pump module. That is, the laser fiber can be unscrewed from the pump block and replaced by an amplifier fiber.

(g) The device of the present invention is readily scalable to higher pump power that will become available in the future based on the ongoing development of higher-power pump-diode modules (i.e., one with an increased amount of available maximum power), based on the improvement in the electrical-to-optical efficiency of pump diodes, and based on the increased brightness of pump diodes enabling better coupling efficiency.

(h) The device of the present invention is designed for either a counter-propagating pumping configuration or a co-propagating pumping configuration. The invention thus maximizes the achievable peak power with minimal optical nonlinear background (using a counter-propagating pumping scheme), or the signal-to-noise ratio of the amplifier is optimized (using a co-propagating pumping scheme).

(i) In the device of the present invention, the pump diodes are intrinsically protected against optical damage (due to wavelength-selective reflector-transmitter dichroic mirrors or equivalent blocking or dispersive elements such as Pelin Broca prisms or similar dispersive devices).

(j) The device of the present invention is designed for high-peak-power applications where the signal-delivery fiber is not required or when it does not make sense to have a signal fiber, as when the peak power is too high (since signal-delivery fibers introduce nonlinearities).

(k) The delivery fiber is optional for "low"-peak power systems (in some embodiments, the delivery fiber optionally uses hollow or photonic band-gap fibers or rods, which can be used for high-peak-power signal delivery).

(l) The device of the present invention has a small form factor (and is readily integrated into existing pump packages with a minimum number of additional optical components beyond those already used and needed in the pump packages).

(m) The device of the present invention makes high-peak-power isolator integration possible since inside the module, a collimated beam is present and therefore the isolator can be directly dropped in. When high average signal power is present, thermal lensing in the isolator should be considered and compensated for, which, in some embodiments, uses additional measures such as beam expansion (e.g., using a larger-diameter collimated beam within the enclosure).

(n) A frequency converter (also called a wavelength converter) is easily integrated inside the package (frequency converter can use optical parametric generators (OPG), harmonic frequency doublers or the like) since typically the signal beam propagates in the pump-diode module device in a hermetically sealed environment provided by the pump-diode module.

(o) The device of the present invention is very cost effective (can be less than $10,000 for 70 W pump power and coupling, and this price can be significantly reduced when purchased in higher quantity).

In some embodiments, delivery fiber 130 or signal fiber 108 of FIG. 1A, FIG. 1B or FIG. 1D includes a hollow-core photonic-band-gap fiber or rod (also called a photonic crystal fiber or rod), optionally also including a hollow endcap, as described in U.S. patent application Ser. No. 11/420,752 titled "OPTICAL HOLLOW-CORE DELIVERY FIBER AND HOLLOW-ENDCAP TERMINATION AND ASSOCIATED METHOD", or a fiber or rod having a solid endcap that allows beam divergence before the end facet, such as described in U.S. patent application Ser. No. 11/420,750 titled "PHOTONIC-CRYSTAL-ROD OPTICAL AMPLIFIER WITH SEALED-HOLE ENDCAP AND ASSOCIATED METHOD" filed 27 May 2006, which are both divisionals of U.S. patent application Ser. No. 11/420,729 titled "FIBER- OR ROD-BASED OPTICAL SOURCE FEATURING A LARGE-CORE, RARE-EARTH-DOPED PHOTONIC-CRYSTAL DEVICE FOR GENERATION OF HIGH-POWER PULSED RADIATION AND METHOD" filed on May 26, 2006, which claims benefit of U.S. Provisional Patent Application 60/703,822 filed on Jul. 29, 2005, titled "FIBER-BASED OPTICAL SOURCE FEATURING A LARGE-CORE, RARE-EARTH-DOPED PHOTONIC CRYSTAL FIBER FOR GENERATION OF HIGH POWER PULSED RADIATION," and U.S. Provisional Patent Application 60/746,166 filed on May 1, 2006, titled "FIBER- OR ROD-BASED OPTICAL SOURCE FEATURING A LARGE-CORE, RARE-EARTH-DOPED PHOTONIC-CRYSTAL DEVICE FOR GENERATION OF HIGH-POWER PULSED RADIATION AND METHOD," and U.S. Provisional Patent Application 60/797,931 filed on May 5, 2006, titled "FIBER- OR ROD-BASED OPTICAL SOURCE FEATURING A LARGE-CORE, RARE-EARTH-DOPED PHOTONIC-CRYSTAL DEVICE FOR GENERATION OF HIGH-POWER PULSED RADIATION AND METHOD". It is contemplated that in some embodiments, any of the components, systems or methods described in the any of the patents referred to herein can be combined with or substituted for components or methods described herein for the present invention. For example, in various embodiments, the gain fiber 138 is replaced by or supplemented with segmented and/or spliced gain media such as described in U.S. patent application Ser. No. 11/565,619 titled "METHOD AND APPARATUS FOR OPTICAL GAIN FIBER HAVING SEGMENTS OF DIFFERING CORE SIZES" filed 30 Nov. 2006, or the gain media described in U.S. patent application Ser. No. 11/567,740 titled "APPARATUS AND METHOD FOR AN ERBIUM-DOPED FIBER FOR HIGH-PEAK-POWER APPLICATIONS" filed 7 Dec. 2006, or U.S. patent application Ser. No. 11/556,658 titled "APPARATUS AND METHOD FOR A WAVEGUIDE WITH AN INDEX PROFILE MANIFESTING A CENTRAL DIP FOR BETTER ENERGY EXTRACTION" filed 3 Nov. 2006, or U.S. patent application Ser. No. 11/426,302 titled "APPARATUS AND METHOD FOR A HIGH-GAIN DOUBLE-CLAD AMPLIFIER" filed 23 Jun. 2006.

In some embodiments, delivery fiber 130 of FIG. 1A provides a level of heat isolation between the laser-diode module 110 and the gain fiber 138. In other embodiments, the use of a delivery fiber 130 would possibly introduce unacceptable losses (especially at the joints) and unacceptable non-linear buildup, and so is omitted in those embodiments (such as shown in FIG. 1C). Similar considerations apply to the signal-output fiber 131 of FIG. 1C or signal-output fiber 132 of FIG. 1D, and care is taken for these fibers or they are also omitted, especially at high-power levels.

In some embodiments, such as shown in FIG. 1C, the signal beam is coupled though a lens 114, which is used to focus light into the end of a fiber 131 in output-fiber connector 192 used for signal port 152. (Instead of using a fiber connector 192 for signal fiber 131, some embodiments connect output-signal fiber 131 using a laser-welded, soldered, or fused signal-fiber connection, such as shown on port 151 of FIG. 1A, enabling very-high-precision positioning of the end of signal fiber 131 relative to focused signal beam 126.) In some embodiments, if desired, a fiber connector 191 for the signal beam is provided for port 151 on the pump diode laser housing 110. In the embodiments shown in FIG. 1A, FIG. 1B, FIG. 1C, and FIG. 1D, light 125 or 126 of the signal wavelength is reflected by dichroic mirror 117, while pump light 128 of the pump wavelength is transmitted by dichroic mirror 117.

FIG. 1C is a block diagram of a diode laser subsystem 102 for pumping gain fibers, with module 172 having an integrated fiber connector 192 at signal output port 152 and an integrated fiber connector 191 at pump-signal port 151 for connecting to an optically pumped gain fiber 138. In most ways, subsystem 102 is the same as subsystem 100 of FIG. 1A; however, in FIG. 1C, pump/signal port 151 includes a connector 191 (e.g., a conventional threaded fiber connector, in some embodiments) for releaseably attaching gain fiber 138. This allows easy exchanging of gain fibers for such uses as amplifiers or lasers, polarization-maintaining (PM) versus non-PM configurations, lower or higher power capabilities, smaller or large core diameters, and the like, any of which can be handled using the same module 110. In some embodiments, an angled facet (to prevent retro-reflections) and a beam-expanding endcap (to prevent optical damage to the facet) are formed at the left end of gain fiber 138. In some embodiments, connector 191 is at a slight angle to the axis of the pump beam and the signal beam inside housing 110, in order to compensate for the prism-type bending of the beams by the angled facet at the left end of gain fiber 138. Further, in some embodiments, gain fiber 138 is directly connected to enclosure 110, rather than using a pigtail or delivery fiber such as shown in FIG. 1A. In some embodiments, the gain fiber 138 has an enlarged endcap and a waveguide that ends at a short distance inside the end facet in order to disperse the beams over a larger area to reduce optical damage to the facet. The end facet, in some embodiments, is angled (non-perpendicular) to the waveguide in order to minimize reflections of the pump or signal beams and to reduce undesirable feedback. In some embodiments, the connector 191 for the pump-signal port 151 is set at a small angle to compensate for prism-like bending of the beams entering or exiting angled facet of the gain fiber 138. In some embodiments, an input-signal fiber 129 is fused to the far end of gain fiber 138, and injects a seed-laser signal in a counter-propagating direction to the pump signal 128. In some embodiments, one or more additional dichroic mirrors 127, each at a non-perpendicular angle to the beam, are used to reduce any leftward-traveling signal light that gets through dichroic mirror 117. In some embodiments, conventional pump block modules that use conventional laser diode bars 111 and beam combiner optics 116, such as are available from LIMO GMBH of Dortmund, Germany (e.g., see www.limo.de/en/laserpump.php) or other sources, are modified to include a signal port 152, in order to form module 110.

In some embodiments, gain fiber 138 (optionally including its seed source and seed fiber 129) can be disconnected from module 172 (e.g., by unscrewing its threaded connector 191) and a different gain fiber 138' (optionally including its seed source and seed fiber 129') can be connected in its place (e.g., by screwing on its threaded connector 191). In some embodiments, one of the gain fibers (e.g., 138) is non-PM (non-polarization maintaining), while the other is PM (e.g., 138'), and keyed connectors allow predetermined orientations of the PM parts. In some embodiments, module 172 is PM for at least the signal path 126.

FIG. 1D is a block diagram of a diode laser subsystem 103 for pumping gain fibers, with module 173 having an integrated signal input port 152 and a fiber connector 191 for connecting to an optically pumped gain fiber 138. In some embodiments, gain fiber 138 is fused to a signal-output fiber (e.g., in some embodiments, a hollow-core photonic-bandgap fiber such as described in U.S. patent application Ser. No. 11/420,752, titled "OPTICAL HOLLOW-CORE DELIVERY FIBER AND HOLLOW-ENDCAP TERMINATION AND ASSOCIATED METHOD") is used for the signal waveguide 132. Since the seed signal is never directed toward the pump diodes 111, there is less need for supplementary dichroic mirrors 127; however they are still included in some embodiments in case there is backward-traveling ASE or reflected amplified signal. In some embodiments, optical isolators are also used in one or more of the paths (e.g., instead of or in addition to mirror 127 and at that location, for example) inside housing 110 to prevent unwanted signal propagation. In some embodiments, gain fiber 138 (optionally including its signal fiber 132) can be disconnected from module 173 (e.g., by unscrewing its threaded connector 191) and a different gain fiber 138' (optionally including its signal fiber 132') can be connected in its place (e.g., by screwing on its threaded connector 191). In some embodiments, one of the gain fibers (e.g., 138) is non-PM (non-polarization maintaining), while the other is PM (e.g., 138'), and keyed connectors allow predetermined orientations of the PM parts. In some embodiments, module 173 is PM for at least the signal path 126.

In various embodiments, any of the gain fibers 138 (optionally including its signal-output fiber 132 or seed-signal fiber 129 or FBG 156) can be disconnected from the respective modules (e.g., modules 172, 173, 174, 175, 176, 177, 270, 271, 272, 278, 279, 370, or 375 of the other Figures herein) (e.g., by unscrewing its threaded connector 191) and a different gain fiber 138' (optionally including its signal-output fiber 132' or seed-signal fiber 129' or FBG) can be connected in its place (e.g., by screwing on its threaded connector 191). In some embodiments, one of the gain fibers (e.g., 138) is non-PM (non-polarization maintaining), while the other is PM (e.g., 138'), and keyed connectors allow predetermined orientations of the PM parts. In some embodiments, the respective modules are PM for at least the signal paths.

FIG. 1E is a block diagram of a diode laser subsystem 104 for pumping gain fibers, with module 174 having an integrated signal output port 152 and a fiber connector 191 for connecting to an optically pumped gain fiber 138. In some embodiments, such as shown in FIG. 1E and FIG. 1F, the dichroic mirror 117A reflects pump power at the pump wavelengths and transmits signal wavelengths. FIG. 1E operates in a similar manner and includes corresponding parts to the embodiments of FIG. 1A and FIG. 1C, except that the pump light does not pass though mirror 117A, and thus this configuration may provide a benefit if the high pump power would cause unacceptable internal heating in the dichroic mirror if the pump beam 128 were instead passed through the mirror, as is the case with mirror 117 of the configuration shown in FIG. 1C. Also, module 110' of FIG. 1E or FIG. 1F passes the signal straight through 110'. Otherwise, the module 110' of FIG. 1E operates to separate amplified signal coming back from the amplifier gain section, similar to FIGS. 1A and 1C.

FIG. 1F is a block diagram of a diode laser subsystem 105 for pumping gain fibers, with module 175 having an integrated signal input port 152 and a fiber connector 191 for connecting to an optically pumped gain fiber 138. FIG. 1F operates in a similar manner and includes corresponding parts to the embodiments of FIG. 1B and FIG. 1D, except that the pump light does not pass though mirror 117A of FIG. 1F, in contrast to the pump light that does pass though mirror 117 of FIG. 1B and FIG. 1D. Also, module 110' of FIG. 1E or FIG. 1F passes the signal straight through 110'. Otherwise, the module 110' of FIG. 1F operates to separate amplified signal coming back from the amplifier gain section, similar to FIGS. 1B and 1D.

FIG. 1G is a block diagram of a diode laser subsystem 106 for pumping a gain fiber to form a laser, with a module 176 having an integrated signal output port 152 and a threaded fiber connector 191 at pump/signal port 151 for connecting to an optically pumped gain fiber 138. In some embodiments, a fiber Bragg grating (FBG) 156, having a line spacing suitable to set the wavelength of the signal beam, is formed on the right-hand end of gain fiber 138, and a partially reflecting facet 157 (perpendicular to the optical axis of the signal beam) is formed on the left end of gain fiber 138, in order to provide sufficient feedback to cause lasing when pumped by pump beam 128. In some embodiments, FBG 156 is partially reflecting and is used as a laser-output end, and facet 157 is highly reflective at the signal wavelength. In some embodiments, partially reflecting facet 157 is replaced by an FBG (partially reflecting at the signal wavelength) and an angled-cleave facet at the left end of gain fiber 138, and the FBG 156 remains at the right end of gain fiber 138 shown in FIG. 1G.

In some embodiments, the central axis of connector 191 is perpendicular to the optical axes of the pump beam and the signal beam in the housing 110 (since the end facet is perpendicular to the optical axes of the beams). In some embodiments, other aspects of module 176 are the same as those of module 172 of FIG. 1C.

FIG. 1H is a block diagram of a diode laser subsystem 107 for pumping gain fibers to form Q-switched lasers, with a module 177 having an integrated signal output port 152 and a threaded fiber connector 191 at pump/signal port 151 for connecting to an optically pumped gain fiber 138. In some embodiments, a fiber Bragg grating (FBG), having a line spacing suitable to set the wavelength of the signal beam, is formed on the right-hand end of gain fiber 138, and a partially reflecting facet 157 (perpendicular to the optical axis of the signal beam) is formed on the left end of gain fiber 138, in order to provide sufficient feedback to cause lasing when pumped by pump beam 128. In some embodiments, a fiber Q-switch element 155 (e.g., such as are available from Fiber-Logix (FiberLogix Limited, Ashley House, Vale Industrial Park, Tolpits Lane, Watford. WD18 9QP, UK), which offers an all-fiber Q-switch element) is fused to gain fiber 138, in order to form the output laser beam into Q-switched pulses. In some embodiments, the central axis of connector 191 is perpendicular to the optical axes of the pump beam and the signal beam in the housing 110 (since the end facet is perpendicular to the optical axes of the beams). In some embodiments, a connector 191 is provided for port 151, but other aspects of module 177 are the same as those of module 170 of FIG.1A.

FIG. 1i is a perspective view of a diode laser subsystem 102 for pumping gain fibers, with an integrated signal output port 152 and a threaded fiber connector 191 at pump/signal port 151 for connecting to an optically pumped gain fiber 138. In some embodiments, a water-cooled heat sink 180 is provided (in some embodiments, having a water-in connection 189 and a water-out connection 187, and optionally including a water-cooled cylinder 188, around which gain fiber 138 is wound (which both cools gain fiber 138 and maintains its bend radius)). In some embodiments, pump light is injected through port 151 into one end of gain fiber 138, and signal power is injected in a counter-propagating direction from the fiber 129 that connects seed source 135 to the opposite end of gain fiber 138. Electrical power is supplied to pump-diode module 172 through electrical connections 182. Other aspects of system 102 are described above in the discussion of FIG. 1C. In other embodiments, other cooling mechanisms are used, such as passive or forced air cooling, helium circulation, Peltier thermoelectric cooling, and the like.

Figure 2A:
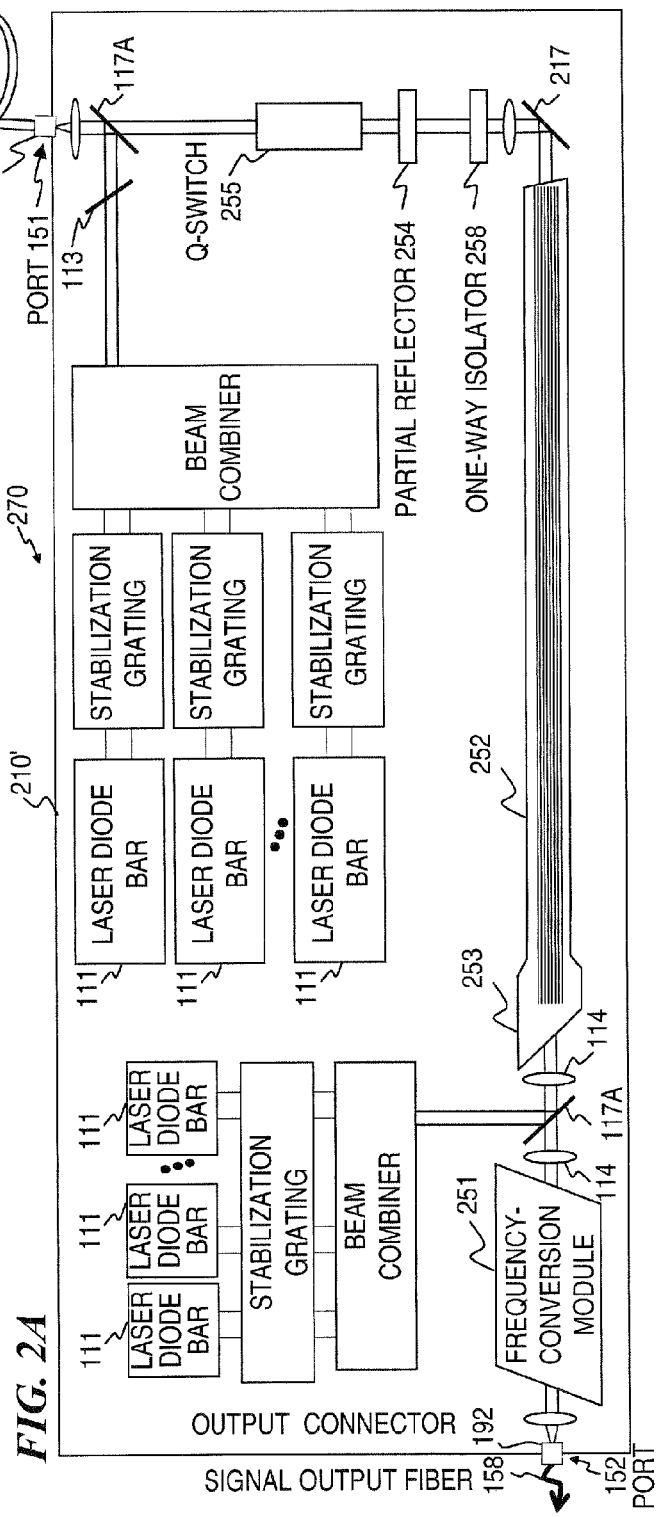
FIG. 2A is a block diagram of a diode laser subsystem 200 for pumping gain fibers, with an internal frequency-conversion module 251, an internal Q-switch 255 and partial reflector 254 for a pulsed laser, and an internal gain stage 252, an integrated signal output port 152 and a fiber connector 191 at pump/signal port 151 for connecting to an optically pumped gain fiber 138.

FIG. 2A is a block diagram of a diode laser subsystem 200 for pumping gain fibers (in some embodiments, one gain fiber 138 can be exchanged for a different gain fiber 138' without otherwise changing the rest of the subsystem 200), with module 270 having an internal frequency-conversion module 251, an internal Q-switch 255 and partial reflector 254 for a pulsed laser, an internal optical isolator (which can be considered to be a one-way valve for light) and an internal gain stage 252, an integrated signal output port 152 having a fiber connector 192, and a fiber connector 191 at pump/signal port 151 for connecting to an optically pumped gain fiber 138. In various embodiments, the frequency-conversion module 251 includes one or more frequency doublers, triplers, quadruplers, or quintuplers such as described in U.S. patent application Ser. No. 11/558,362 titled "ULTRAVIOLET LASER SYSTEM AND METHOD HAVING WAVELENGTH IN THE 200-NM RANGE" filed 9 Nov. 2006 and/or optical parametric oscillators or generators such as described in U.S. patent application Ser. No. 11/484,358 titled "APPARATUS AND METHOD FOR PUMPING AND OPERATING OPTICAL PARAMETRIC OSCILLATORS USING DFB FIBER LASERS" filed 10 Jul. 2006. In various embodiments, the amplifier segment(s) 252 includes one or more gain fibers or photonic crystal rods such as described in U.S. patent application Ser. No. 11/420,730, titled "MULTI-SEGMENT PHOTONIC-CRYSTAL-ROD WAVEGUIDES FOR AMPLIFICATION OF HIGH-POWER PULSED OPTICAL RADIATION AND ASSOCIATED METHOD". As can be seen, any number of optical elements and features can be included in (and added to or deleted from) housing 210. Further additional pump diodes and beam combiners can be added in housing 210' to pump active elements such as gain rod 252. In some embodiments, the end facets of gain rod 252 are beveled, and the output end (the left-hand end in the FIG. 2A) is configured to widen the beam to avoid optical damage to the left-end facet. In some embodiments, one or more high-reflectivity mirrors 217 (e.g., multi-layer dielectric mirrors having high reflectivity at the signal wavelengths) are used to fold the optical path within housing 210' for a smaller footprint. Other aspects are as described above.

Figures 2B, 2C:
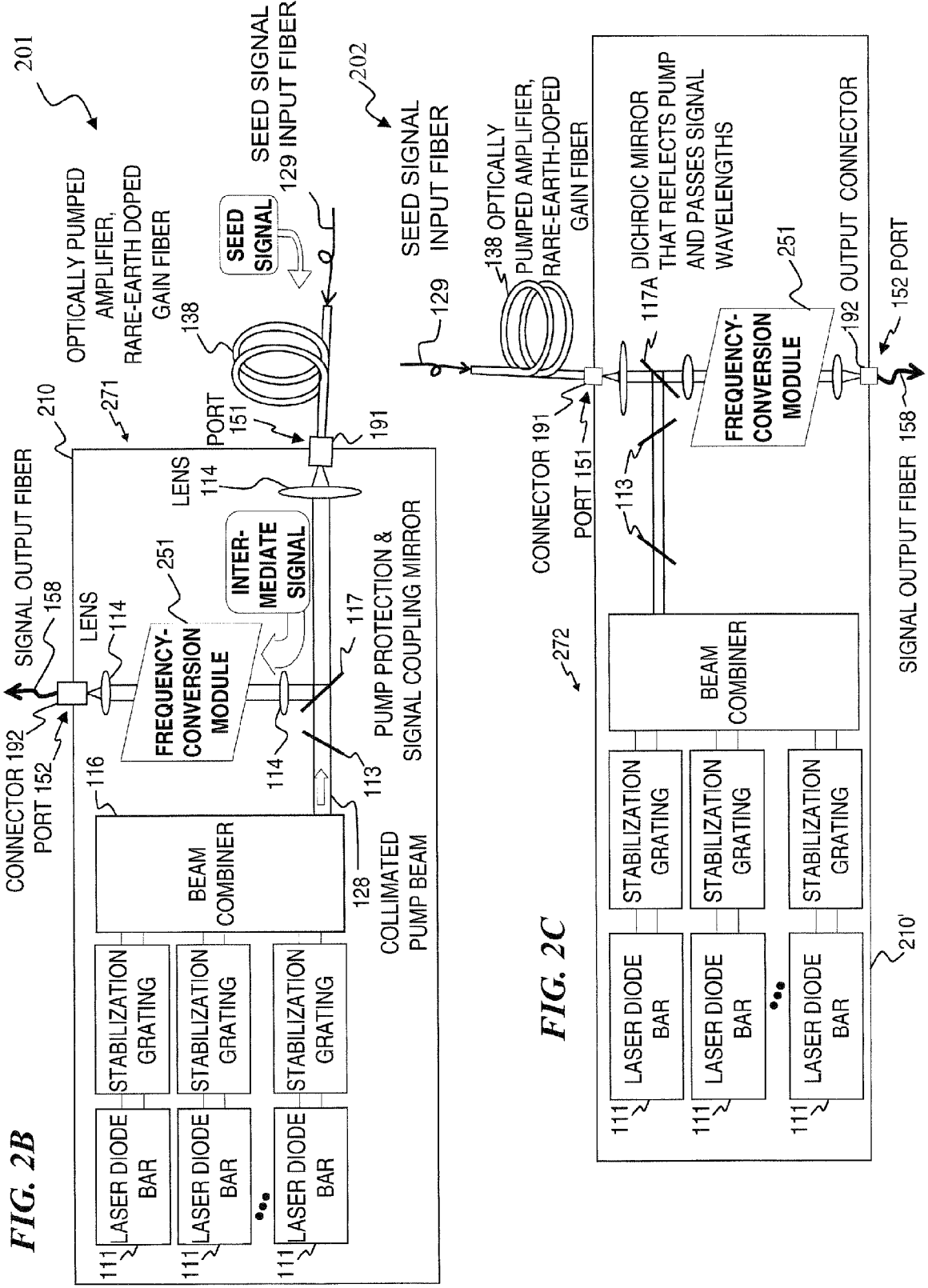
FIG. 2B is a block diagram of a diode laser subsystem 201 for pumping gain fibers, with a pump-transmissive/signal-reflective dichroic mirror 117, an internal frequency-conversion module 251, an integrated signal output port 152 and a fiber connector 191 at pump/signal port 151 for connecting to an optically pumped gain fiber 138.
FIG. 2C is a block diagram of a diode laser subsystem 202 for pumping gain fibers, with a pump-reflective/signal-transmissive dichroic mirror 117A, an internal frequency-conversion module 251, an integrated signal output port 152 and a fiber connector 191 at pump/signal port 151 for connecting to an optically pumped gain fiber 138.

FIG. 2B is a block diagram of a diode laser subsystem 201 for pumping gain fibers, with module 271 having a pump-transmissive/signal-reflective dichroic mirror 117, an internal frequency-conversion module 251, an integrated signal output port 152 and a fiber connector 191 at pump/signal port 151 for connecting to an optically pumped gain fiber 138. In various embodiments, the frequency-conversion module 251 is as described above for FIG. 2A. Other aspects of FIG. 2B are the same as those described above for FIG. 1C.

FIG. 2C is a block diagram of a diode laser subsystem 202 for pumping gain fibers, with module 272 having a pump-reflective/signal-transmissive dichroic mirror 117A, an internal frequency-conversion module 251, an integrated signal output port 152 and a fiber connector 191 at pump/signal port 151 for connecting to an optically pumped gain fiber 138. In various embodiments, the frequency-conversion module 251 is as described above for FIG. 2A. Other aspects of FIG. 2B are the same as those described above for FIG. 1E.

Figure 2D:
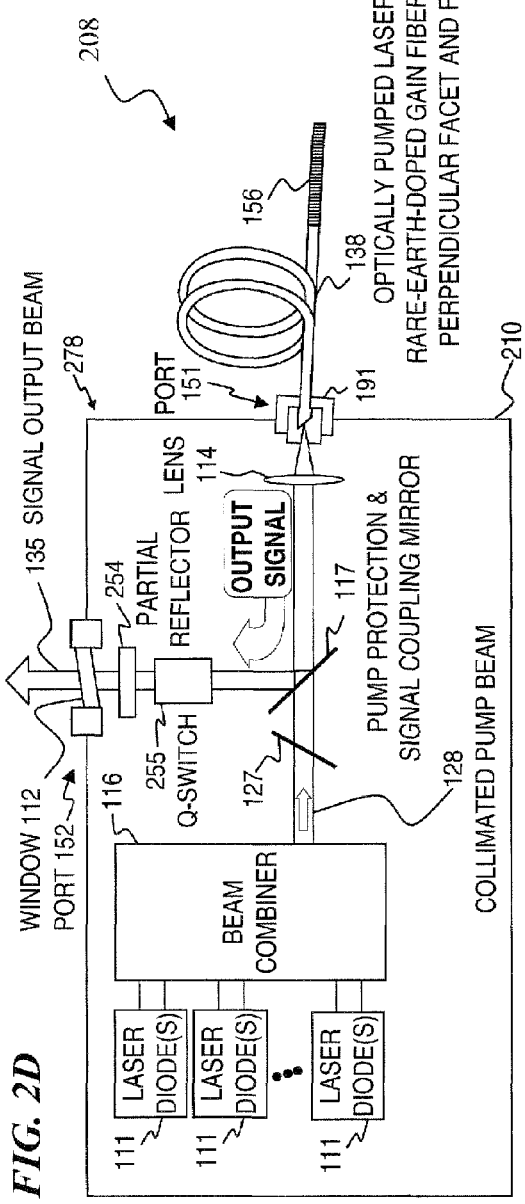
FIG. 2D is a block diagram of a diode laser subsystem 208 for pumping gain fibers to form Q-switched lasers, with a pump-transmissive/signal-reflective dichroic mirror 117, an integrated signal output port 152 and a fiber connector 191 at pump/signal port 151 for connecting to an optically pumped gain fiber 138.

FIG. 2D is a block diagram of a diode laser subsystem 208 for pumping gain fibers to form Q-switched lasers, with module 278 having a pump-transmissive/signal-reflective dichroic mirror 117, an integrated signal output port 152 and a fiber connector 191 at pump/signal port 151 for connecting to an optically pumped gain fiber 138. The Q-switched laser here is similar to that of FIG. 1H, except that the Q-switch is a non-fiber-based element (such as an acousto-optical modulator a Pockels cell (which are active switches capable of very fast repetition rates), or a saturable absorber (which tends to be slower and is a passive element)) located internal to housing 210 of module 278, and partial reflector 254 replaces non-beveled facet 157 as the left-end feedback element.

Figure 2E:
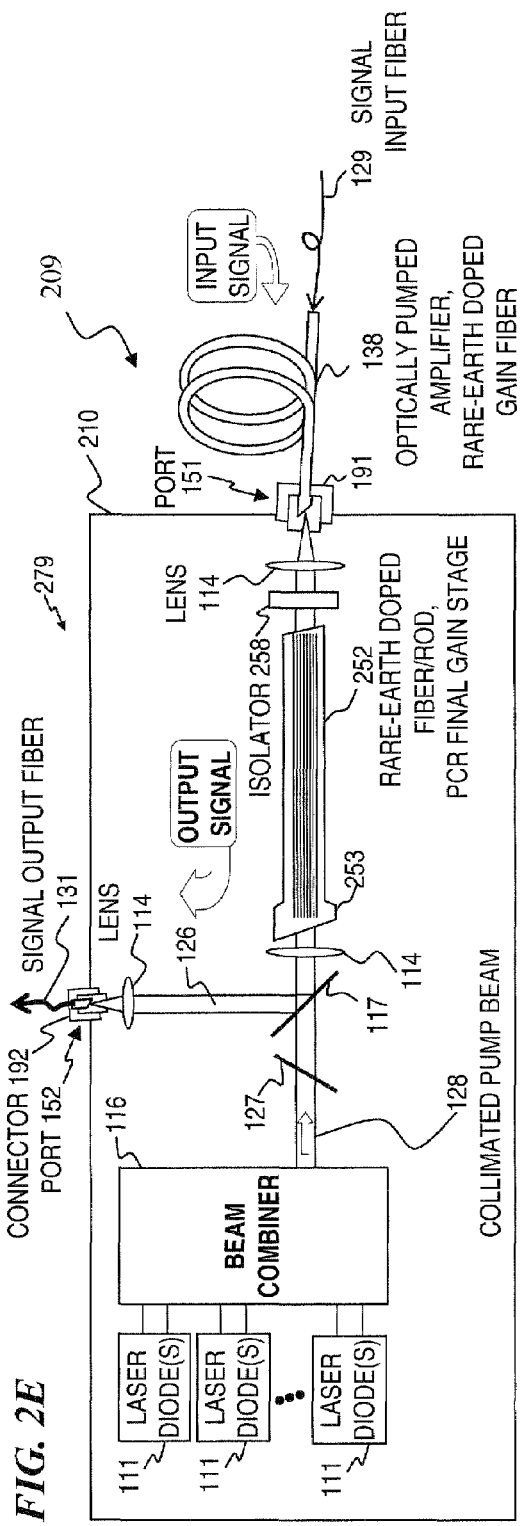
FIG. 2E is a block diagram of a diode laser subsystem 209 for pumping external gain fibers, but having an internal final gain stage, with a pump-transmissive/signal-reflective dichroic mirror 117, an integrated signal output port 152 and a fiber connector 191 at pump/signal port 151 for connecting to an optically pumped gain fiber 138.

FIG. 2E is a block diagram of a diode laser subsystem 209 for pumping external gain fibers, but having an internal final gain stage 252, with module 279 having a pump-transmissive/signal-reflective dichroic mirror 117, an integrated signal output port 152 and a fiber connector 191 at pump/signal port 151 for connecting to an optically pumped gain fiber 138. Module 279 includes an amplifying fiber or rod (segment) 252 (such as described above for FIG. 2A) which is pumped by a portion of the pump light, where the rest of the pump light passes through amplifying segment 252 and is used to pump external gain medium 138. Other aspects of this embodiment are as described above for FIG. 1C.

Figure 3A:
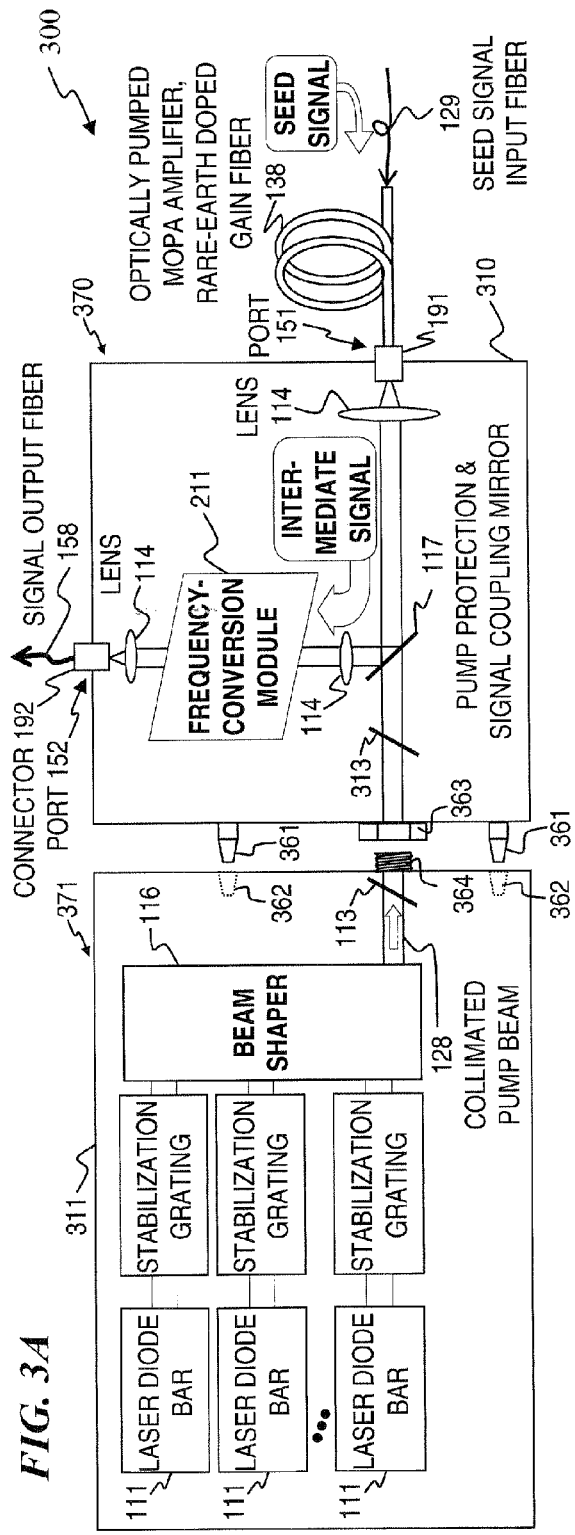
FIG. 3A is a block diagram of a two-part diode laser subsystem 300 for pumping gain fibers, with an integrated signal output port 152 and a fiber connector 191 at pump/signal port 151 for connecting to an optically pumped gain fiber 138.

FIG. 3A is a block diagram of a two-part diode laser subsystem 300 for pumping gain fibers, with two modules: module 371 having the laser diodes 111 and an uncovered opening through threaded connector 364, and module 370 having an integrated signal output port 152 and a fiber connector 191 at pump/signal port 151 for connecting to an optically pumped gain fiber 138. In some embodiments, this two-part pump module 370 and 371 includes a screw-together set of mating threaded connectors 363 and 364, and one or more alignment pins 361 used to align the various parts. This configuration allows alternative configurations to be substituted for module 370 (e.g., versions of module 370 that do not include the frequency-conversion module, or that include other parts such the right-hand portions of the embodiments as shown in FIG. 1C, FIG. 1E, FIG. 1G, FIG. 1H, FIG. 2C, FIG. 2D, FIG. 2E, the right-hand and lower portions of FIG. 2A, or the right-hand-lower portion of FIG. 3B). Thus, in some embodiments, the enclosure of the pump-diode module is formed by affixing two or more enclosure portions, and in some such embodiments, an air-tight seal encloses the internal light paths. In some embodiments, the replaceable pump-signal combiner module 370 includes one or more signal blocking elements 313, and pump-block module 371 also includes one or more signal blocking elements 113. Other aspects of subsystem 300 are as described above.

Figure 3B:
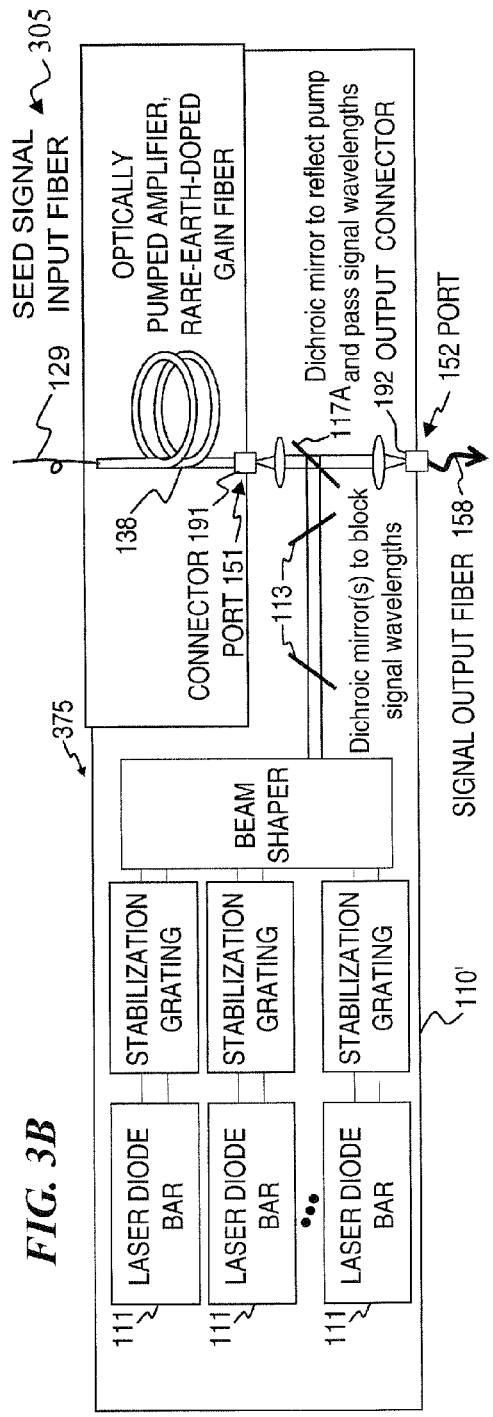
FIG. 3B is a block diagram of a diode laser subsystem 305 for pumping gain fibers, an integrated signal output port 152 and a fiber connector 191 at pump/signal port 151 for connecting to an optically pumped gain fiber 138.

FIG. 3B is a block diagram of a diode laser subsystem 305 for pumping gain fibers, with module 375 having an integrated signal output port 152 and a fiber connector 191 at pump/signal port 151 for connecting to an optically pumped gain fiber 138. In some embodiments, subsystem 305 is formed on a unifying heat sink, such as shown and described above for FIG. 1*i*; however module 375 uses a housing 110' having a pump-reflective, signal transmissive dichroic mirror 117A. Other aspects of subsystem 305 are as described above for FIG. 1*i*.

Some embodiments of the invention provide a method that includes—within an enclosure (e.g., enclosure 110 of FIG. 1C), wherein the enclosure has a first port 151 and a second port 152—combining and/or collimating light from one or more laser diodes 111 into a collimated pump-light beam 128, wherein the pump light in the collimated pump-light beam 128 has a characteristic first wavelength; directing pump light inside the enclosure 110 from the collimated pump-light beam 128 to the first external port 151; and directing signal light 125 (as in FIG. 1D) or 126 (as in FIG. 1C) inside the enclosure between the first external port 151 and the second external port 152, wherein the signal light 125 or 126 has a characteristic second wavelength different than the first wavelength.

Some embodiments of the method further include substantially blocking, inside the enclosure, signal light from reaching the one or more laser diodes. Some embodiments of the method further include non-imaging of any signal light (i.e., the signal light which was not blocked by the substantially blocking signal light) to keep it from reaching the one or more laser diodes.

Some embodiments of the method further include wavelength converting, inside the enclosure, at least a portion of the signal light having the characteristic second wavelength to a characteristic third wavelength. Some embodiments further include providing feedback inside the enclosure in order to lase the signal light.

In some embodiments of the method (such as shown in FIG. 1C), the directing of signal light inside the enclosure includes wavelength-selective reflecting of signal light from the first port towards the second port, and the directing of pump light inside the enclosure includes wavelength-selective transmitting the collimated pump-light beam towards the first port. Some such embodiments of the method further include directly connecting a first end of a first gain fiber 138 (in some embodiments, one that is rare-earth doped) outside the enclosure to the first port; coupling a seed signal having the second wavelength to a second end of the first gain fiber 138 such that the seed signal and the pump light counter-propagate in the first gain fiber 138; and amplifying the seed signal in the first gain fiber 138 using power from the pump light. Some embodiments of the method further include disconnecting the first end of the first gain fiber 138 from the first port 151; directly connecting a first end of a second gain fiber 138' (in some embodiments, one that is rare-earth doped) outside the enclosure to the first port 151, wherein one or more characteristics of the second gain fiber are different than corresponding characteristics of the first gain fiber; coupling a seed signal having the second wavelength to a second end of the second gain fiber such that the seed signal and the pump light counter-propagate in the second gain fiber; and amplifying the seed signal in the second gain fiber using power from the pump light. In some embodiments, the first gain fiber is a polarization-maintaining fiber, and the method further includes maintaining a polarization of the signal light within the enclosure. Some embodiments of the method further include connecting a first end of a delivery fiber outside the enclosure to the first port; connecting a second end of a delivery fiber to a first end of a gain fiber (in some embodiments, one that is rare-earth doped) outside the enclosure; coupling a seed signal having the second wavelength to a second end of the gain fiber such that the seed signal and the pump light counter-propagate in the gain fiber; and amplifying the seed signal in the gain fiber using power from the pump light.

In some embodiments of the method (such as shown in FIG. 1E), the directing of signal light inside the enclosure includes wavelength-selective transmitting of a signal light from the first port towards the second port, and the directing of pump light inside the enclosure includes wavelength-selective reflecting the collimated pump-light beam towards the first port. Some such embodiments of the method further include directly connecting a first end of a gain fiber (in some embodiments, one that is rare-earth doped) outside the enclosure to the first port; coupling a seed signal having the second wavelength to a second end of the gain fiber such that the seed signal and the pump light counter-propagate in the gain fiber; and amplifying the seed signal in the gain fiber using power from the pump light. Some such embodiments of the method further include disconnecting the first end of the first gain fiber from the first port; directly connecting a first end of a second gain fiber (in some embodiments, one that is rare-earth doped) outside the enclosure to the first port, wherein one or more characteristics of the second gain fiber are different than corresponding characteristics of the first gain fiber; coupling a seed signal having the second wavelength to a second end of the second gain fiber such that the seed signal and the pump light counter-propagate in the second gain fiber; and amplifying the seed signal in the second gain fiber using power from the pump light. In some such embodiments, the first gain fiber is a polarization-maintaining fiber, and the method further includes maintaining a polarization of the signal light within the enclosure. Some embodiments of the method further include connecting a first end of a delivery fiber outside the enclosure to the first port; connecting a second end of a delivery fiber to a first end of a gain fiber (in some embodiments, one that is rare-earth doped) outside the enclosure; coupling a seed signal having the second wavelength to a second end of the gain fiber such that the seed signal and the pump light counter-propagate in the gain fiber; and amplifying the seed signal in the gain fiber using power from the pump light.

In some embodiments of the method (such as shown in FIG. 1D), the directing of signal light inside the enclosure includes wavelength-selective reflecting of signal light from the second port towards the first port and the directing of pump light inside the enclosure includes wavelength-selective transmitting the collimated pump-light beam towards the first port. Some such embodiments of the method further include directly connecting a first end of a gain fiber (in some embodiments, one that is rare-earth doped) outside the enclosure to the first port; coupling a seed signal having the second wavelength from the second port to the first end of the gain fiber such that the seed signal and the pump light co-propagate in the gain fiber; and amplifying the seed signal in the gain fiber using power from the pump light. Some such embodiments of the method further include connecting a first end of a delivery fiber outside the enclosure to the first port; connecting a second end of a delivery fiber to a first end of a gain fiber (in some embodiments, one that is rare-earth doped) outside the enclosure; coupling a seed signal having the second wavelength from the second port to the first end of the gain fiber such that the seed signal and the pump light co-propagate in the gain fiber; and amplifying the seed signal in the gain fiber using power from the pump light.

In some embodiments of the method (such as shown in FIG. 1F), the directing of signal light inside the enclosure includes wavelength-selective transmitting of signal light from the second port towards the first port and the directing of pump light inside the enclosure includes wavelength-selective reflecting the collimated pump-light beam towards the first port. Some such embodiments of the method further include directly connecting a first end of a gain fiber (in some embodiments, one that is rare-earth doped) outside the enclosure to the first port; coupling a seed signal having the second wavelength from the second port to the first end of the gain fiber such that the seed signal and the pump light co-propagate in the gain fiber; and amplifying the seed signal in the gain fiber using power from the pump light. Some embodiments of the method further include connecting a first end of a delivery fiber outside the enclosure to the first port; connecting a second end of a delivery fiber to a first end of a gain fiber (in some embodiments, one that is rare-earth doped) outside the enclosure; coupling a seed signal having the second wavelength from the second port to the first end of the gain fiber such that the seed signal and the pump light co-propagate in the gain fiber; and amplifying the seed signal in the gain fiber using power from the pump light.

In some embodiments, the present invention provides an apparatus that includes an enclosure, wherein the enclosure has a first port and a second port; one or more laser diodes held within the enclosure; a beam shaper held within the enclosure and optically coupled to receive pump light from one or more laser diodes and to provide a collimated pump-light beam, wherein the pump light in the collimated pump-light beam has a characteristic first wavelength; and a first wavelength-selective optical element configured to direct pump light inside the enclosure from the collimated pump-light beam to the first external port and to direct signal light inside the enclosure between the first external port and the second external port, wherein the signal light has a characteristic second wavelength different than the first wavelength.

Some embodiments of the apparatus further include a second wavelength-selective optical element configured to substantially block, inside the enclosure, signal light from reaching the one or more laser diodes.

In some embodiments, the beam shaper has a non-imaging characteristic configured such that any signal light not blocked by the first wavelength-selective optical element is not imaged towards the one or more laser diodes.

Some embodiments of the apparatus further include a wavelength converter held inside the enclosure and operable to receive the signal light and to convert at least a portion of the signal light having the characteristic second wavelength to a characteristic third wavelength.

Some embodiments of the apparatus further include a gain medium coupled to the first port; and one or more feedback elements configured to form a laser using the gain medium.

In some embodiments of the apparatus (such as shown in FIG. 1C), the first wavelength-selective optical element includes a dichroic beam-splitter mirror configured to reflect the signal light from the first port towards the second port and to transmit the collimated pump-light beam towards the first port. Some embodiments of the apparatus further include a first gain fiber (in some embodiments, one that is rare-earth doped) outside the enclosure, wherein a first end of the first gain fiber is directly connected to the first port; and a seed-signal source that supplies a seed signal having the second wavelength to a second end of the first gain fiber such that the seed signal and the pump light counter-propagate in the first gain fiber, and wherein the apparatus is configured to amplify the seed signal in the first gain fiber using power from the pump light. Some embodiments of the apparatus further include a second gain fiber (in some embodiments, one that is rare-earth doped), wherein a first end of the second gain fiber is configured to be directly connected to the first port, and the apparatus is configured to enable the first gain fiber to be disconnected from the first port and exchanged by having the second gain fiber connected to the first port. In some embodiments, the first gain fiber is a polarization-maintaining fiber, and wherein the apparatus is configured to maintain a polarization of the signal light within the enclosure. Some embodiments of the apparatus further include a delivery fiber outside the enclosure, wherein the delivery fiber is a hollow-core photonic-bandgap fiber having a hollow-endcap termination at a first end, and wherein the first end of the delivery fiber is connected to the first port; a first gain fiber (in some embodiments, one that is rare-earth doped) outside the enclosure, wherein a first end of the first gain fiber is connected to a second end of the delivery fiber; and a seed-signal source that supplies a seed signal having the second wavelength to a second end of the first gain fiber such that the seed signal and the pump light counter-propagate in the first gain fiber, and wherein the apparatus is configured to amplify the seed signal in the first gain fiber using power from the pump light.

In some embodiments of the apparatus (such as shown in FIG. 1E), the first wavelength-selective optical element includes a dichroic beam-splitter mirror configured to transmit signal light from the first port towards the second port and to reflect the collimated pump-light beam towards the first port. Some such embodiments of the apparatus further include a first gain fiber (in some embodiments, one that is rare-earth doped) outside the enclosure, wherein a first end of the first gain fiber is directly connected to the first port; and a seed-signal source that supplies a seed signal having the second wavelength to a second end of the first gain fiber such that the seed signal and the pump light counter-propagate in the first gain fiber, and wherein the apparatus is configured to amplify the seed signal in the first gain fiber using power from the pump light. Some embodiments of the apparatus further include a second gain fiber (in some embodiments, one that is rare-earth doped), wherein a first end of the second gain fiber is configured to be directly connected to the first port, and the apparatus is configured to enable the first gain fiber to be disconnected from the first port and exchanged by having the second gain fiber connected to the first port. In some such embodiments, the first gain fiber is a polarization-maintaining fiber, and wherein the apparatus is configured to maintain a polarization of the signal light within the enclosure.

Some embodiments of the apparatus further include a delivery fiber outside the enclosure, wherein the first end of the delivery fiber is connected to the first port; a first gain fiber (in some embodiments, one that is rare-earth doped) outside the enclosure, wherein a first end of the first gain fiber is connected to a second end of the delivery fiber; and a seed-signal source that supplies a seed signal having the second wavelength to a second end of the first gain fiber such that the seed signal and the pump light counter-propagate in the first gain fiber, and wherein the apparatus is configured to amplify the seed signal in the first gain fiber using power from the pump light.

In some embodiments of the apparatus (such as shown in FIG. 1D), the first wavelength-selective optical element includes a dichroic beam-splitter mirror configured to reflect signal light from the second port towards the first port and to transmit the collimated pump-light beam towards the first port. Some embodiments of the apparatus further include a first gain fiber (in some embodiments, one that is rare-earth doped) outside the enclosure, wherein a first end of the first gain fiber is directly connected to the first port; and a seed-signal source that supplies a seed signal having the second wavelength to the second port, and the apparatus directs the seed signal to the first end of the first gain fiber such that the seed signal and the pump light co-propagate in the first gain fiber, and wherein the apparatus is configured to amplify the seed signal in the first gain fiber using power from the pump light. Some embodiments of the apparatus further include a delivery fiber outside the enclosure, wherein the first end of the delivery fiber is connected to the first port; a first gain fiber (in some embodiments, one that is rare-earth doped) outside the enclosure, wherein a first end of the first gain fiber is connected to a second end of the delivery fiber; and a seed-signal source that supplies a seed signal having the second wavelength to the second port, and the apparatus directs the seed signal to the first end of the first gain fiber such that the seed signal and the pump light co-propagate in the first gain fiber, and wherein the apparatus is configured to amplify the seed signal in the first gain fiber using power from the pump light.

In some embodiments of the apparatus (such as shown in FIG. 1F), the first wavelength-selective optical element includes a dichroic beam-splitter mirror configured to transmit signal light from the second port towards the first port inside the enclosure and to reflect the collimated pump-light beam towards the first port inside the enclosure. Some embodiments of the apparatus further include a first gain fiber (in some embodiments, one that is rare-earth doped) outside the enclosure, wherein a first end of the first gain fiber is directly connected to the first port; and a seed-signal source that supplies a seed signal having the second wavelength to the second port, and the apparatus directs the seed signal to the first end of the first gain fiber such that the seed signal and the pump light co-propagate in the first gain fiber, and wherein the apparatus is configured to amplify the seed signal in the first gain fiber using power from the pump light. Some embodiments of the apparatus further include a delivery fiber outside the enclosure, wherein the first end of the delivery fiber is connected to the first port; a first gain fiber (in some embodiments, one that is rare-earth doped) outside the enclosure, wherein a first end of the first gain fiber is connected to a second end of the delivery fiber; and a seed-signal source that supplies a seed signal having the second wavelength to the second port, and the apparatus directs the seed signal to the first end of the first gain fiber such that the seed signal and the pump light co-propagate in the first gain fiber, and wherein the apparatus is configured to amplify the seed signal in the first gain fiber using power from the pump light.

In some embodiments, the present invention provides an apparatus that includes an enclosure, wherein the enclosure has a first port and a second port; one or more laser diodes held within the enclosure; means for directing pump light inside the enclosure from the collimated pump-light beam to the first external port; and means for directing signal light inside the enclosure between the first external port and the second external port, wherein the signal light has a characteristic second wavelength different than the first wavelength.

Some embodiments of the apparatus further include means for wavelength converting, inside the enclosure, at least a portion of the signal light having the characteristic second wavelength to a characteristic third wavelength.

Some embodiments of the apparatus further include means for providing feedback inside the enclosure in order to lase the signal light.

In some embodiments of the apparatus, the means for directing of signal light inside the enclosure includes means for wavelength-selective reflecting of signal light from the first port towards the second port and the means for directing of pump light inside the enclosure includes means for wavelength-selective transmitting the collimated pump-light beam towards the first port.

Some embodiments of the apparatus means for directly connecting a first end of a first gain fiber outside the enclosure to the first port; means for coupling a seed signal having the second wavelength to a second end of the first gain fiber such that the seed signal and the pump light counter-propagate in the first gain fiber; and means for amplifying the seed signal in the first gain fiber using power from the pump light.

Some embodiments of the apparatus further include means for directly connecting a first end of a first gain fiber outside the enclosure to the first port; means for coupling signal feedback having the second wavelength to the first gain fiber; and means for lasing in the first gain fiber using power from the pump light.

Some embodiments of the apparatus further include means for disconnecting the first end of the first gain fiber from the first port; means for directly connecting a first end of a second gain fiber outside the enclosure to the first port, wherein one or more characteristics of the second gain fiber are different than corresponding characteristics of the first gain fiber; means for coupling a seed signal having the second wavelength to a second end of the second gain fiber such that the seed signal and the pump light counter-propagate in the second gain fiber; and means for amplifying the seed signal in the second gain fiber using power from the pump light.

In some embodiments of the apparatus, the first gain fiber is a polarization-maintaining fiber, and the apparatus further includes means for maintaining a polarization of the signal light within the enclosure.

Some embodiments of the apparatus further include means for connecting a first end of a delivery fiber outside the enclosure to the first port; means for connecting a second end of a delivery fiber to a first end of a gain fiber outside the enclosure; means for coupling a seed signal having the second wavelength to a second end of the gain fiber such that the seed signal and the pump light counter-propagate in the gain fiber; and means for amplifying the seed signal in the gain fiber using power from the pump light.

In some embodiments of the apparatus, the means for directing of signal light inside the enclosure includes means for wavelength-selective transmitting of a signal light from the first port towards the second port and the means for directing of pump light inside the enclosure includes means for wavelength-selective reflecting the collimated pump-light beam towards the first port.

It is specifically contemplated that the present invention includes embodiments having combinations and subcombinations of the various embodiments and features that are individually described herein (i.e., rather than listing every combinatorial of the elements, this specification includes descriptions of representative embodiments and contemplates embodiments that include some of the features from one embodiment combined with some of the features of another embodiment). Further, some embodiments include fewer than all the components described as part of any one of the embodiments described herein.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. An optical coupling method for modular apparatus, the method comprising:
    providing an enclosure, wherein the enclosure has a first external port and a second external port;
    providing a first delivery fiber connected to the first port;
    providing a first gain fiber, wherein a first end of the first gain fiber is connected to the delivery fiber, wherein the first gain fiber is outside the enclosure; and within the enclosure:
        generating laser light from a plurality of laser diodes that are within the enclosure;
        collimating light from the plurality of laser diodes into a collimated pump-light beam, wherein the pump light in the collimated pump-light beam has a characteristic first wavelength;
        directing pump light inside the enclosure from the collimated pump-light beam to exit the enclosure via the first external port such that the pump light propagates through the delivery fiber to the first gain fiber, and wherein the directing of pump light inside the enclosure includes wavelength-selective transmitting the collimated pump-light beam towards the first port;
        receiving signal light coming from the first gain fiber outside the enclosure through the delivery fiber and through the first external port, wherein the signal light has a characteristic second wavelength different than the first wavelength; and
        directing signal light inside the enclosure between the first external port and the second external port such that light derived from the signal light exits the enclosure via the second external port, wherein the directing of signal light inside the enclosure includes wavelength-selective reflecting of signal light from the first port towards the second port.

2. The method of claim 1, further comprising:
    non-linear wavelength converting, inside the enclosure, at least a portion of the signal light having the characteristic second wavelength to a characteristic third wavelength.

3. The method of claim 1, further comprising:
    providing feedback inside the enclosure in order to lase the signal light.

4. An optical coupling method for modular apparatus, the method comprising:
    providing an enclosure, wherein the enclosure has a first external port and a second external port;
    providing a first delivery fiber connected to the first port;
    providing a first gain fiber, wherein a first end of the first gain fiber is connected to the delivery fiber, wherein the first gain fiber is outside the enclosure; and within the enclosure:
        generating laser pump light from a plurality of laser diodes that are within the enclosure;
        stabilizing the pump light using at least one grating;
        collimating the pump light from the plurality of laser diodes into a collimated pump-light beam, wherein the pump light in the collimated pump-light beam has a characteristic first wavelength;
        directing the pump light inside the enclosure from the collimated pump-light beam to exit the enclosure into the delivery fiber via the first external port;
        receiving signal light coming from the delivery fiber outside the enclosure through the first external port, wherein the signal light has a characteristic second wavelength different than the first wavelength; and
        directing the signal light inside the enclosure between the first external port and the second external port such that light derived from the signal light exits the enclosure via the second external port; and
    coupling a seed signal having the second wavelength to a second end of the first gain fiber such that the seed signal and the pump light counter-propagate in the first gain fiber; and
    amplifying the seed signal in the first gain fiber using power from the pump light.

5. The method of claim 4, wherein the directing of signal light inside the enclosure includes wavelength-selective reflecting of signal light from the first port towards the second port and the directing of pump light inside the enclosure includes wavelength-selective transmitting the collimated pump-light beam towards the first port.

6. The method of claim 4, further comprising:
    disconnecting the first end of the first delivery fiber from the first port;
    directly connecting a first end of a second delivery fiber outside the enclosure to the first port, wherein the second delivery fiber is connected to a second gain fiber, and wherein one or more characteristics of the second gain fiber are different than corresponding characteristics of the first gain fiber;
    coupling a seed signal to a second end of the second gain fiber such that the seed signal and the pump light counter-propagate in the second gain fiber; and
    amplifying the seed signal in the second gain fiber using power from the pump light.

7. The method of claim 4, wherein the providing of the delivery fiber includes providing a photonic-crystal delivery fiber, and connecting the photonic-crystal delivery fiber to the enclosure using solder.

8. The method of claim 4, wherein the directing of signal light inside the enclosure includes wavelength-selective transmitting of a signal light from the first port towards the second port and the directing of pump light inside the enclosure includes wavelength-selective reflecting the collimated pump-light beam towards the first port.

9. An optical coupling method for modular apparatus, the method comprising:
providing an enclosure, wherein the enclosure has a first external port and a second external port;
connecting a first delivery fiber to the first port;
connecting a first end of a first gain fiber to the delivery fiber, wherein the first gain fiber is outside the enclosure; and
within the enclosure:
generating laser pump light from one or more laser diodes that are within the enclosure;
collimating the pump light from the one or more laser diodes into a collimated pump-light beam, wherein the pump light in the collimated pump-light beam has a characteristic first wavelength;
directing the pump light inside the enclosure from the collimated pump-light beam to exit the enclosure via the first external port such that the pump light propagates through the delivery fiber to the gain fiber, and signal light from the gain fiber propagates through the delivery fiber to the first external port;
receiving the signal light coming from outside the enclosure through the first external port, wherein the signal light has a characteristic second wavelength different than the first wavelength;
directing the signal light inside the enclosure between the first external port and the second external port such that light derived from the signal light exits the enclosure via the second external port; and
coupling signal feedback having the second wavelength to the first gain fiber such that lasing occurs in-the first gain fiber using power from the pump light.

10. The method of claim 9, wherein the first gain fiber is a polarization-maintaining fiber, the method further comprising:
maintaining a polarization of the signal light within the enclosure.

11. A modular optical coupling apparatus comprising:
an enclosure, wherein the enclosure has a first external port and a second external port;
a plurality of laser diodes held within the enclosure, and configured to output pump light;
a beam shaper held within the enclosure and optically coupled to receive pump light from the plurality of laser diodes and to provide a collimated pump-light beam, wherein the pump light in the collimated pump-light beam has a characteristic first wavelength;
at least one stabilization grating located in an optical path between the plurality of laser diodes and the beam shaper and configured to stabilize the pump light;
a first wavelength-selective optical element configured to direct pump light inside the enclosure from the collimated pump-light beam to the first external port and to direct signal light inside the enclosure between the first external port and the second external port, wherein the signal light has a characteristic second wavelength different than the first wavelength;
a delivery fiber outside the enclosure, wherein a first end of the delivery fiber is connected to the first port; and
a first gain fiber outside the enclosure, wherein a first end of the first gain fiber is connected to a second end of the delivery fiber.

12. The apparatus of claim 11, further comprising:
a second wavelength-selective optical element located between the first wavelength-selective optical element and the plurality of laser diodes and configured to substantially block, inside the enclosure, signal light from reaching the one or more laser diodes, wherein at least the first wavelength-selective element includes a dichroic mirror.

13. The apparatus of claim 11, further comprising:
a non-linear wavelength converter held inside the enclosure and operable to receive the signal light from the first port having the characteristic second wavelength and to convert at least a portion of the signal light having the characteristic second wavelength to a characteristic third wavelength.

14. A modular optical-coupling apparatus comprising:
an enclosure, wherein the enclosure has a first external port and a second external port;
one or more laser diodes held within the enclosure;
a beam shaper held within the enclosure and optically coupled to receive pump light from one or more laser diodes and to provide a collimated pump-light beam, wherein the pump light in the collimated pump-light beam has a characteristic first wavelength;
a first wavelength-selective optical element configured to direct pump light inside the enclosure from the collimated pump-light beam to exit the enclosure through the first external port and to direct signal light inside the enclosure between the first external port and the second external port, wherein the signal light has a characteristic second wavelength different than the first wavelength;
a delivery fiber outside the enclosure, wherein a first end of the delivery fiber is directly connected to the first port;
a first gain fiber outside the enclosure, wherein a first end of the first gain fiber is connected to a second end of the delivery fiber; and
a seed-signal source that supplies a seed signal having the second wavelength to a second end of the first gain fiber such that the seed signal and the pump light counter-propagate in the first gain fiber, and wherein the apparatus is configured to amplify the seed signal in the first gain fiber using power from the pump light.

15. The apparatus of claim 14, further comprising:
a gain medium coupled to the first port; and
one or more feedback elements configured to form a laser using the gain medium.

16. The apparatus of claim 14, wherein the first wavelength-selective optical element includes a dichroic beam-splitter mirror configured to reflect the signal light from the first port towards the second port and to transmit the collimated pump-light beam towards the first port.

17. The apparatus of claim 14, further comprising:
a second gain fiber, wherein a first end of the second gain fiber is configured to be directly connected to the delivery fiber, and the apparatus is configured to enable the first gain fiber to be disconnected from the delivery fiber and exchanged by having the second gain fiber connected to the first port.

18. The apparatus of claim 14, wherein the first gain fiber is a polarization-maintaining fiber, and wherein the apparatus is configured to maintain a polarization of the signal light within the enclosure.

19. The apparatus of claim 14,
wherein the delivery fiber is a hollow-core photonic-bandgap fiber having a hollow-endcap termination at a first end.

20. The apparatus of claim 14, wherein the first wavelength-selective optical element includes a dichroic beam-splitter mirror configured to signal light from the first port towards the second port and to transmit the collimated pump-light beam towards the first port.

21. A modular optical coupling apparatus comprising:
an enclosure, wherein the enclosure has a first external port and a second external port;
a plurality of laser diodes held within the enclosure;
means for combining laser light from the plurality of laser diodes into a collimated pump-light beam;
means for directing pump light inside the enclosure from the collimated pump-light beam to exit the enclosure through the first external port, and wherein the means for directing of pump light inside the enclosure includes means for wavelength-selective transmitting the collimated pump-light beam towards the first port;
a delivery fiber located external to the enclosure and configured to couple the pump light from the first external port to a gain fiber and to couple signal light from the gain fiber to the first eternal port, wherein the delivery fiber is connected to the first external port; and
means for directing signal light inside the enclosure between the first external port and the second external port, wherein the signal light has a characteristic second wavelength different than the first wavelength, wherein the means for directing of signal light inside the enclosure includes means for wavelength-selective reflecting of signal light from the first port towards the second port.

22. The apparatus of claim 21, further comprising:
means for non-linear wavelength converting, inside the enclosure, at least a portion of the signal light having the characteristic second wavelength to a characteristic third wavelength.

23. The apparatus of claim 21, further comprising:
means for providing feedback inside the enclosure in order to lase the signal light.

24. A modular optical coupling apparatus comprising:
an enclosure, wherein the enclosure has a first external port and a second external port;
a plurality of laser diodes that are held within the enclosure and that generate pump light;
means for stabilizing the pump light using at least one grating;
means for collimating the pump light from the the plurality of laser diodes into a collimated pump-light beam, wherein the pump light in the collimated pump-light beam has a characteristic first wavelength;
means for directing pump light inside the enclosure from the collimated pump-light beam to exit the enclosure through the first external port, wherein the means for directing pump light inside the enclosure is transmissive to pump light;
means for directing signal light inside the enclosure between the first external port and the second external port, wherein the signal light has a characteristic second wavelength different than the first wavelength, wherein the means for directing signal light inside the enclosure is reflective to signal light;
delivery-fiber means for coupling light between a first end of a first gain fiber outside the enclosure and the first port;
means for coupling a seed signal having the second wavelength to a second end of the first gain fiber such that the seed signal and the pump light counter-propagate in the first gain fiber; and
means for amplifying the seed signal in the first gain fiber using power from the pump light.

25. The apparatus of claim 24, wherein the means for directing of signal light inside the enclosure includes means for wavelength-selective reflecting of signal light from the first port towards the second port and the means for directing of pump light inside the enclosure includes means for wavelength-selective transmitting the collimated pump-light beam towards the first port.

26. The apparatus of claim 24, wherein the first gain fiber is a polarization-maintaining fiber, the apparatus farther comprising:
means for maintaining a polarization of the signal light within the enclosure.

27. The apparatus of claim 24, wherein the delivery-fiber means further includes
a delivery fiber located outside the enclosure and having a first end permanently affixed to the first port
and a second end connected to the first end of the gain fiber outside the enclosure.

28. The apparatus of claim 24, wherein the means for directing of signal light inside the enclosure includes means for wavelength-selective transmitting of a signal light from the first port towards the second port and the means for directing of pump light inside the enclosure includes means for wavelength-selective reflecting the collimated pump-light beam towards the first port.

29. A modular optical coupling apparatus comprising:
an enclosure, wherein the enclosure has a first external port and a second external port;
one or more laser diodes held within the enclosure;
means for collimating the pump light from the one or more laser diodes into a collimated pump-light beam, wherein the pump light in the collimated pump-light beam has a characteristic first wavelength;
means for directing pump light inside the enclosure from the collimated pump-light beam to the first external port;
delivery-fiber means for coupling the pump light from the first external port to a gain fiber and for coupling signal light from the gain fiber to the first eternal port, wherein the delivery-fiber means is external to the enclosure and is connected to the first external port;
means for directing signal light inside the enclosure between the first external port and the second external port, wherein the signal light has a characteristic second wavelength different than the first wavelength;
means for coupling signal feedback having the second wavelength to the first gain fiber; and
means for lasing in the first gain fiber using power from the pump light.

30. The apparatus of claim 29, further comprising:
means for disconnecting the first gain fiber;
means for connecting a second gain fiber outside the enclosure to the delivery-fiber means, wherein one or more characteristics of the second gain fiber are different than corresponding characteristics of the first gain fiber;
means for coupling a seed signal having the second wavelength to a second end of the second gain fiber such that the seed signal and the pump light counter-propagate in the second gain fiber; and
means for amplifying the seed signal in the second gain fiber using power from the pump light.

* * * * *

UNITED STATES PATENT AND TRADEMARK OFFICE
CERTIFICATE OF CORRECTION

PATENT NO. : 7,537,395 B2 Page 1 of 1
APPLICATION NO. : 11/682234
DATED : May 26, 2009
INVENTOR(S) : Matthias P. Savage-Leuchs It is certified that error appears in the above-identified patent and that said Letters Patent is hereby corrected as shown below:

In Column 25, Line 3 (line 3 of claim 20):
Delete "mirror configured to signal light from the first port"
and insert --mirror configured to reflect signal light from the first port-- therefor.

Signed and Sealed this

Eighth Day of September, 2009

David J. Kappos
*Director of the United States Patent and Trademark Office*